United States Patent [19]
O'Shaughnessy

[11] Patent Number: 6,166,670
[45] Date of Patent: Dec. 26, 2000

[54] SELF CALIBRATING CURRENT MIRROR AND DIGITAL TO ANALOG CONVERTER

[76] Inventor: Timothy G. O'Shaughnessy, 12415 Latigo Blvd., Elbert, Colo. 80908

[21] Appl. No.: 09/189,055

[22] Filed: Nov. 9, 1998

[51] Int. Cl.[7] .................................................. H03M 1/00
[52] U.S. Cl. ........................................... 341/136; 341/145
[58] Field of Search .................................... 341/136, 153, 341/172, 158, 159, 155

[56] References Cited

U.S. PATENT DOCUMENTS

| | | | |
|---|---|---|---|
| 5,017,919 | 5/1991 | Hull et al. ................................. | 314/136 |
| 5,115,151 | 5/1992 | Hull et al. ................................. | 341/136 |
| 5,283,582 | 2/1994 | Krenik ...................................... | 341/158 |
| 5,353,028 | 10/1994 | De Wit et al. ........................... | 341/172 |
| 5,594,388 | 1/1997 | O'Shaughnessy et al. ............. | 331/111 |
| 5,798,723 | 9/1998 | Fong ......................................... | 341/136 |

*Primary Examiner*—Howard L. Williams
*Assistant Examiner*—Jean B. Jeanglaude

[57] ABSTRACT

A self calibrating current mirror circuit has a curent mirror input for receiving an input current, and a current mirror output for providing an output current. The circuit utilizes a comparator, a charge pump and a MOS transistor having a drain connected to pair of transfer gates. In a first mode of operation, the current of the MOS transistor is switched to the current mirror input for calibration. The comparator provides a signal to the charge pump to increase or to decrease the gate voltage of the MOS transistor. In a second mode of operation the current of the MOS transistor is switched to the current mirror output. A plurality of self calibrating current mirror stages are used to obtain a current mirror that provides an output with multiple current levels, for use as a switched current digital to analog converter (DAC).

20 Claims, 17 Drawing Sheets

SELF CALIBRATING CURRENT MIRROR AND DIGITAL TO ANALOG CONVERTER

CROSS-REFERENCE TO RELATED APPLICATIONS

This application is related to U.S. patent application Ser. No. 09/118,215 filed Jul. 17, 1998, titled TUNABLE OSCILLATOR USING A REFERENCE INPUT FREQUENCY, now U.S. Pat. No. 6,016,081.

STATEMENT REGARDING FEDERALLY SPONSERED RESEARCH OR DEVELOPMENT

Not Applicable

REFERENCE TO MICROFICHE APPENDIX

Not Applicable

BACKGROUND OF THE INVENTION AND DESCRIPTION OF PRIOR ART

The present invention relates to the field of current mirror circuits and more particularly to such circuits that are fabricated by using integrated circuit processes. The subject invention is a precision current mirror topology that provides improved performance over prior art. The subject invention provides improve precision in a switched current digital to analog converter (DAC) by reducing errors introduced by replicating currents.

In general, a current mirror is a circuit that produces an output current in response to a current applied to the input. The current mirror output replicates the input current, hence the term "current mirror". The current mirror is a basic analog building block. The current mirror is used in comparators, operational amplifiers, balanced modulators and many other circuit topologies.

The current mirror is also the basic circuit element of switched current digital to analog converters (DACs). The switched current DAC is a multiple output current mirror with an array of switch transistors that steer the mirror currents. By summing the mirror currents, the current steering DAC produces an output current that is proportional to the digital input code. As such, an invention that improves current mirror accuracy shall also produce improved precision in DACs.

FIG. 1 discloses a simple prior art current mirror circuit. FIG. 1 has an input terminal 114 for receiving an input current. The input current is often produced by another circuit or device that is either on or off the chip. FIG. 1 shows a first PMOS transistor 110 having a gate electrode connected to a gate common node 140, and also to the drain 112 of the first PMOS transistor 110. The common gate node 140 is also connected to the gate of a second PMOS transistor 120A and the gate of a third PMOS transistor 120B. The drain 122A of the second PMOS transistor 120A is connected to a first output terminal 124A of the current mirror. The drain 122B of third PMOS transistor 120B is connected to a second output terminal 124B of the current mirror.

A first output load 128A is connected to the first output terminal 124A of the current mirror circuit. A second output load 128B is also connected to the second output terminal 124B of the current mirror circuit. In addition, the source electrodes of the PMOS transistors 110, 120A and 120B are connected to a common voltage node AVDD.

For the sake of the present discussion, the electrical parameters of all three PMOS transistors 110, 120A and 120B shall be considered equal or matched. In addition all three devices are long channel devices operated in the "saturated square law region". Under these assumptions, the drain current of a MOS transistor is independent of the drain voltage. The drain current Id is then only a function of the gate to source voltage. As such this "ideal" current mirror produces output currents I1 and I2 that are equal to the applied input current Iin.

The current mirror of FIG. 1 performs the following operations. The input current, Iin is converted to a common gate to source voltage, Vgs at the common gate node 140 by the diode connected PMOS transistor 110. The common gate voltage Vgs is applied to the gate electrodes of PMOS transistors 120A and 120B. As such PMOS transistors 120A and 120B produce drain currents I1 and I2.

$$Vgsin = F(Iin) \quad (1)$$

$$Vgs1 = Vgs2 = Vgsin \quad (2)$$

$$Id = F^{-1}(Vgs) \quad (3)$$

$$I1 = I2 = F^{-1}(Vgsin) = Iin \quad (4)$$

In equation (1), the gate to source voltage Vgsin is produced by the transfer function F. Equation (2) shows that the gate to source voltage Vgs1 and Vgs2 are equal to Vgsin, which results from connecting the gates of PMOS transistors 110, 120A and 120B to the common gate node 140. Equations (3) show that the drain current Id is the inverse operation or inverse function of F, denoted as $F^{-1}$ of Vgs. Equation (4) shows that mirror output currents I1 and I2 are both equal to the current mirror input current.

Once again it must be emphasized that equations (1), (2), (3) and (4) are only ideal relationships that are unobtainable under realistic conditions. They are only intended to show here that the current mirror converts the input current to voltage, and then that voltage is used to replicate the input current. If all electrical parameters of PMOS devices 110, 120A and 120B were identical and the effective drain impedances were infinite, then equations (1), (2) (3) and (4) would be valid and the output currents I1 and I2 would be identical to the input current Iin.

In reality the current mirror of FIG. 1 is fabricated with real devices which limit performance. The MOS transistor has a finite drain impedance when operated in the "saturated square law region". When the drain voltage increases, the depletion region of the drain moves under the gate in the direction of the source. This region shall collect carriers and as such the effective gate length of the MOS device is shortened. This condition is often called "channel length modulation". As such the drain impedance is approximately proportional to the drain length and inversely proportional to the drain current of the MOS transistor.

Even with a gate length of 10 microns, it is not unusual for the output current of the mirror circuit of FIG. 1 to change 10 per cent as the output voltage changes by 2 volts.

In addition, the current mirror of FIG. 1 is sensitive to device mismatch in electrical parameters. In any fabrication process there must be some tolerance allowed in order to fabricate devices having an acceptable yield. The process tolerances produce variations in the device parameters. From lot to lot there is an allowed variance in key process parameters. For example oxide thickness of the MOS devices are plus or minus 10 per cent of the nominal value. As a consequence, there are also variations across a wafer, and across the integrated circuit device. In a typical CMOS or BICMOS process some parameters match very well and some parameters do not.

For a long channel MOS transistor, operated in the "saturated square law region", the drain current Id is predicted as:

$$Id = K' W/L \, [Vgs-Vt]^2 \quad (5)$$

where, K' and Vt are process dependent parameters.

The drain current Id is a function of process dependent parameters K' and the MOS threshold voltage Vt. The parameter K' is a function of the insulator material (gate oxide) and is inversely proportional to the oxide thickness. In addition, K' is also a function of the semiconductor mobility, which in turn is dependent on the impurity concentration. The MOS threshold voltage is dependent on the oxide thickness, the carrier concentration, the material used for the gate electrode and the density of interface states at the gate oxide to semiconductor interface.

For a typical CMOS process, K' has a lot to lot tolerance of +/−10 per cent of its nominal value. The MOS threshold voltage has a lot to lot tolerance of about 0.1 volts to 0.2 volts of the nominal value. Upon the same integrated circuit device, K' shall exhibit a variation of perhaps 0.5 per cent, and Vt shall exhibit a variation of +/−0.02 volts. Even "matched" MOS devices in close proximity exhibit a 0.01 volt Vt mismatch.

In addition the channel width W and gate length L shall also exhibit variations due to processing tolerances, even on the same integrated circuit. By design, the variation in drain current due to variations in W and L are minimized by designing devices with large W and L. As such, 0.1 micron mismatch in L shall produce a variation of about 1 per cent in the drain current for a MOS device having a design length of 10 microns. Penalties result from the design of large devices. First, the capacitance shall increase, which limits the operating frequency. Second, area increases which shall increase the cost of the integrated circuit.

To evaluate the mismatch in drain current, equation (5) is evaluated using two MOS transistors having anticipated mismatches. The drain current Iin of a first MOS transistor and the drain current Iout of a second MOS are evaluated. The error is determined as:

$$\text{error} = [Iout/Iin - 1] \quad (6)$$

Equation (6) shows positive error for the current mirror output when Iout is greater than Iin. Likewise, the current mirror error is negative when Iout is less than Iin.

Substituting the corresponding parameters for the first and second MOS transistors of equation (5) into equation (6) the following equation occurs.

$$\text{error} = \frac{K'2 W2 L1 (Vgs - Vt2)^2}{K'1 W2 L2 (Vgs - Vt1)^2} - 1 \quad (7)$$

To represent a typical CMOS process, the following parametric values were selected.

$K'1 = 100 \, uA/vv \quad W1 = 10 \text{ microns}, \quad L1 = 10 \text{ microns}$ $K'2 = 100.5 \, uA/vv \quad L1 = 10.1 \text{ microns}, \quad L2 = 9.9 \text{ microns}$ $Vgs - Vt2 = 1.01 \text{ volts}$ $Vgs - Vt1 = 1.00 \text{ volts}$ For these selected parameters the anticipated error is 5.0 per cent. As W and L increase, the anticipated error approaches a limit of 2.5 per cent.

For most CMOS processes, the dominate error term of equation (7) is the MOS threshold voltage mismatch, Vt2−Vt1. In this example the threshold voltage mismatch contributes 2.1 per cent. The error due to threshold voltage mismatch is:

$$\text{error} = \frac{2 \times (Vt2 - Vt1)}{(Vgs - Vt1)} \quad (8)$$

It is observed that the error of Vt mismatch decreases as Vgs−Vt increases. However, increasing Vgs−Vt requires more power supply voltage or limits the maximum output voltage of the current mirror output.

The current mirror circuit shown in FIG. 2, labeled prior art, provides increased drain impedance to improve performance over the circuit shown by FIG. 1. The current mirror of FIG. 2. includes a diode connected MOS transistor 210 with a drain connected to a common gate node 240. The current mirror circuit also includes MOS transistors 220A and 220B that produce drain currents at drain electrodes 222A and 222B respectively. Each MOS transistors 220A and 220B produce a a drain current in response to the voltage applied at the common gate node 240.

The current mirror of FIG. 2 also includes MOS transistors 226A and 226B. These MOS transistors are connected to form a cascode topology. MOS transistor 226A has source connected to the drain of current mirror MOS transistor 222A. Likewise, MOS transistor 226B has a source connected to the current mirror MOS transistor 222B. The gates of both MOS transistors 226A and 226B are connected to a bias circuit 290 that provides a bias voltage. The drains of the MOS transistors 226A and 226B are connected to the respective output loads.

In FIG. 2 both MOS transistors 222A and 222B produce a low source impedance to the drains of current mirror transistors 222A and 222B respectively. As such, a change in load voltage at the drains of MOS transistors 226A and 226B produces a much smaller change in voltage at the drains of MOS transistors 222A and 222B respectively.

The circuit of FIG. 2 provides improved performance over FIG. 1 because the change in the load voltage produces only a very small change in the current mirror output current. This circuit is often referred to as a "cascoded current mirror".

Although the circuit of FIG. 2 overcomes one serious limitation of FIG. 1, a major limitation remains in the circuit of FIG. 2. The circuit of FIG. 2 does not solve or improve upon the error due to device mismatch.

FIG. 3, which is labeled prior art, discloses a circuit that reduces the error due to device mismatch under certain conditions. FIG. 3 shows a current mirror that includes MOS transistors 310, 320A and 320B. MOS transistor 310 is connected as a diode, having the drain connected to the gate, which is also connected to the common gate node 340. In addition, FIG. 3 includes the resistors 316, 326A and 326B which are each connected to the source of the corresponding MOS transistor. The drain 312 of MOS transistor 310 is connected to the source of input current 318. The drain 322A of MOS transistor 320A and the drain 322B of MOS transistor of 320B are each connected to a corresponding output load.

In FIG. 3 MOS transistors 310, 320A and 320B are operated in the saturated region. In addition, it is assumed that a significant voltage occurs across the three resistors 316, 326A and 326B. As such, device mismatch in K', W, L or Vt shall produce a mismatch in the corresponding gate to source voltage. As such, a corresponding change in voltage shall occur across the corresponding resistor. For example, let the input current Iin be such that 1.0 volts occurs across the resistor 316. A mismatch in device parameters produces a mismatch in gate to source voltage between MOS transistors 310 and 320A. The mismatch in voltage shall then occur across resistor 326A, in addition to the voltage across the resistor 316. In this case a mismatch of 0.01 volts produces an error of less than 1.0 per cent. In the circuit of FIG. 1 the equivalent error was:

$$\text{error} = 2\ (Vt1 - Vt2)/(Vgs1 - Vt) \tag{8}$$

An error in Vt of 0.01 volts produces an error of 2 per cent when Vgs–Vt is 1 volt. As such the circuit of FIG. 3 provides certain advantages. The voltage across the resistor in FIG. 3 is more than twice as effective as the gate to source voltage of FIG. 1 in improving accuracy. Therefore, a larger voltage is available at the current mirror output for a given accuracy. The resistor connected to the source of the MOS transistor of the current mirror output increases the output impedance. This reduces the sensitivity to the current mirror output voltage.

The current mirror of FIG. 3 improves accuracy by increasing the output impedance and by reducing sensitivity to device mismatch. This improved accuracy occurs with certain disadvantages and limitations. The current mirror of FIG. 3. requires a resistor for each current mirror output. For small currents large resistors are required to to improve accuracy. The resistors must have large values for both length and width so that the resistors match. These resistors often require large chip area. Over process and temperature the sheet resistance shall vary, which imposes a minimum and maximum voltage across the resistor for a specific input current. At one extreme, a maximum error occurs. At the other extreme, the output voltage range is limited. The circuit of FIG. 3 provides improved matching only over limited range of current. If the current is too small, the circuit becomes sensitive to device mismatches. When current is too large, insufficient supply voltage exists to drive the output load.

A switched current digital to analog converter (DAC) often comprises an array of current mirror outputs that are switched to a output node. Such a circuit is described in detail in U.S. Pat. No. 5,017,919 which is hereby incorporated by reference in its entirety. The accuracy of a switched current DAC is dependent on the accuracy of replicating currents. As such, the DAC produces various accuracy errors that are directly dependent on device mismatches.

Certain DAC specifications describe these accuracy errors. These include RESOLUTION, DNL, INL, FULL SCALE ERROR and THD. RESOLUTION is the number of code bits of the DAC. To obtain higher resolution on a DAC the DNL error must decrease. Otherwise, the DAC will exhibit non-monotonic behavior. DNL is the differential non-linearity error. This specification describes the consistency of the DAC output from a specified code step, to the next code step. The INL is the intergral non-linearity error. This term describes the worst case cumulative error of the DAC over all codes from a straight line. The FULL SCALE ERROR is the difference between measured full scale output and the ideal full scale output. THD is the total harmonic distortion. THD is the total distortion the DAC produces in replicating a sinusoidal waveform. THD is a function of DNL, INL and quantization error.

All of these accuracy specifications of a switched current DAC depend on the mismatch of the output current elements. As such these specifications depend on the matching accuracy of the current mirror structures of the DAC. The current mirror matching accuarcy depends on the musmatch in device parameters and on circuit topology. Improving the matching accuracy of the current mirrors of the switched current DAC improves the accuracy performance of the DAC.

The current mirror structures disclosed in FIG. 1, FIG. 2 and FIG. 3 have mismatch errors. As such, the mismatch in current shall contribute to DNL, INL, FULL SCALE ERROR and THD. The DNL results from the mismatch of current in current mirror elements and from the mismatch in current of binary weighted current structures. The INL results from DNL and from the mismatch of current mirror elements due to process gradients. The FULL SCALE ERROR results from a mismatch of the mirror input reference to the average of current mirror elements.

In switched current DACs the DNL is reduced by using fully decoded switch current elements. The fully decoded structure has an advantage that the current mirror mismatch error is not amplified by the binary weighted ratio. However, the fully decoded structure requires a much larger number of current mirror stages and the decoding logic to decode the binary weighted input. As resolution of the DAC increases it becomes essential to use fully decoded structures to keep the DNL error less than 1 LSB. However, as resolution increases it becomes essential to use binary weighted structures to keep the circuit complexity reasonable. For a fully decoded structure increasing the resolution by 1 bit doubles the circuit complexity and chip area.

It is therefore observed that the mismatch error of current mirror circuits produces numerous adverse effects. To obtain a specified accuracy, large geometry devices must be used. In addition, to obtain improved accuracy additional circuit elements must be used such as cascode devices and resistors. The additional circuit elements shall require an increase in chip area and cost. Often, the required accuracy is only obtained under limited operating ranges of output voltage and current.

As such, a current mirror topology having improved accuracy shall reduce chip area and cost while enhancing the circuit performance in the application employed. The claimed invention provides a current mirror circuit that reduces the mismatch error thereby improving the performance within the applications.

SUMMARY OF THE INVENTION

The invention is a self calibrating current mirror. The invention is a current mirror circuit that compares the output current to the input current. The circuit then adjusts the operating point of the current mirror transistors such that output current matches the input current.

The invention is a current mirror that provides an output current that accurately replicates the input current. The invention provides many advantages over the prior art. The mismatch current error is significantly less than that of prior art current mirror circuits. The invention allows a reduction in the chip area by eliminating the requirement for large geometry devices. The invention also provides for elimination of circuit elements that are used to improve current matching such as the resistors shown in FIG. 3. The invention provides an increased operating range of both current and voltage.

In addition, the invention provides improved performance for switched current DACs by significantly decreasing the mismatch error of unit current sources and ratio errors in bit weighted arrays. As such the invention reduces DNL, INL, FULL SCALE ERROR and THD. The improved accuracy allows the reliable fabrication of high resolution DACs with reasonable chip area, yield and cost.

DETAILED DESCRIPTION OF THE INVENTION

The invention is a self calibrating current mirror that reduces the errors resulting from device mismatches. The invention utilizes some of the operating principles disclosed in the following U.S. Patents, which are hereby incorporated by reference, each in its entirety:

U.S. Pat. No. 5,594,388 is hereby incorporated entirely by reference.
U.S. Pat. No. 5,552,748 is hereby incorporated entirely by reference.
U.S. Pat. No. 5,115,151 is hereby incorporated entirely by reference.
U.S. Pat. No. 5,017,919 is hereby incorporated entirely by reference.

Figure 4:
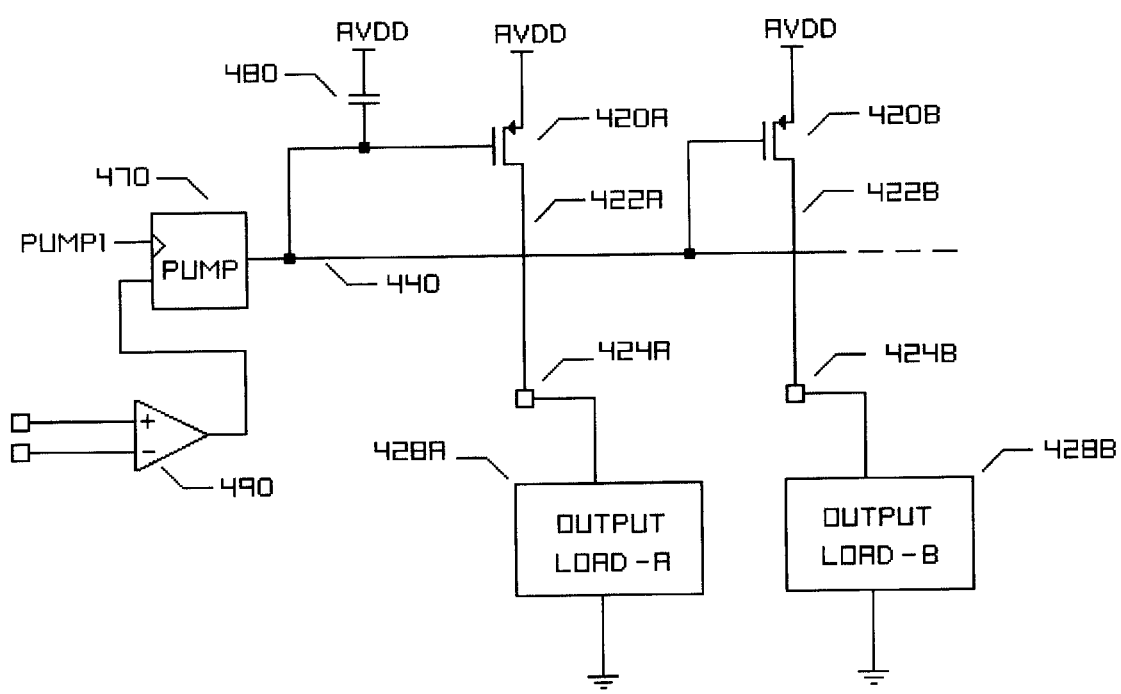
FIG. 4 illustrates a current mirror type feedback circuit that uses a charge pump to drive a common gate node of multiple current source transistors used in a related patent application.

FIG. 4 shows a circuit structure used in a related U.S. patent application, which is entitled A TUNABLE OSCILLATOR USING A REFERENCE INPUT FREQUENCY, Ser. No. 09/118,215 by Timothy G. O'Shaughnessy. The disclosure of this patent application is hereby incorporated by reference in its enirety. The circuit structure of FIG. 4 is used to mirror a current from a frequency to current converter to a current to frequency converter.

The circuit of FIG. 4 includes a comparator 490, a charge pump 470, a first current source MOS transistor 420A, a second current source MOS transistor 420B, a common gate node 440, a first current mirror output load 428A and a second current mirror output load 428B. The circuit of FIG. 4 allows for additional current mirror output MOS transistors to be connected in a similar manner.

The basic problem, as already disclosed herein, is that device mismatches shall cause the drain current of transistor 420B to be different than the drain current of 420A. In addition, any additional transistors connected in similar manner shall also have different drain currents. In the patent application A TUNABLE OSCILLATOR USING A REFERENCE INPUT FREQUENCY, the difference in drain current shall produce an error in oscillator output frequency.

Figure 5:
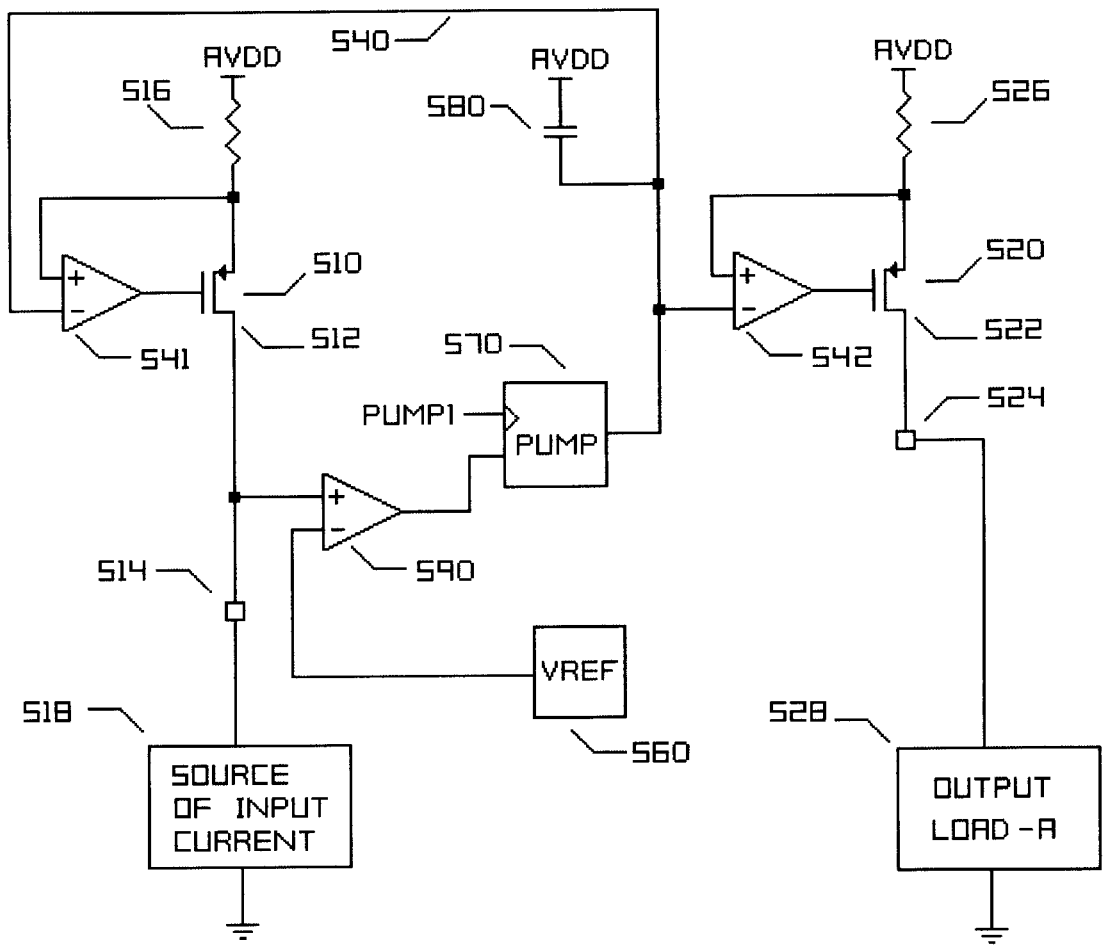
FIG. 5 is a diagram of a self calibrating current mirror using multiple self calibrating operational amplifiers, that is used in a related patent application.

To limit the mismatch current error, the circuit structure shown in FIG. 5 was disclosed in that same patent application. The circuit structure of FIG. 5 includes a comparator 590, a charge pump 570, a first current mirror MOS transistor 510 and a second current mirror MOS transistor 520 connected in similar manner as shown in FIG. 4. In addition FIG. 5 also includes a first self calibrating operational amplifier 541, second self calibrating operational amplifier 542, a first resistor 516 and a second resistor 526. The non-inverting inputs of both operational amplifiers are connected to common node 540, which is the output of charge pump 570. The output of the first operational amplifier is connected to the gate of the first current mirror MOS transistor 510. The output of second operational amplifier is connected to the gate of the second current mirror MOS transistor 520. The inverting inputs of both operational amplifiers are connected to the respective current sensing resistors 516 and 526.

The structure shown in FIG. 5 forms a current mirror that has improved current matching over the structure of FIG. 4. In FIG. 5 the operational amplifiers control the gate voltages of the current mirror MOS transistors, such that the voltages across the resistors 516 and 526 are matched. The circuit of FIG. 5 eliminates the error resulting from mismatches in the current mirror MOS transistors 510 and 520. As such, the circuit shown in FIG. 5 forms a self calibrating current mirror.

The operational amplifiers of FIG. 5 are self calibrating. The self calibrating operational amplifier samples its own offset voltage and subtracts that voltage from the input. As such a self calibrating operational amplifier has an extremely small offset voltage. The device mismatches within the self calibrating operational amplifiers do not contribute to a mismatch in the current mirror output. Also, parametric mismatches in the current mirror MOS transistors 510 and 520 of FIG. 5 do not produce current mismatch error.

However, mismatch in the resistors 516 and 526 of FIG. 5 shall produce a mismatch current error. Although the source voltages of MOS transistors 510 and 520 are matched, the resistances of the resistors 516 and 526 have a mismatch error. To reduce the mismatch error of the resistors, large geometry devices must be used. Even then, the sheet resistivity of the resistors shall have some mismatch, perhaps 0.5 per cent or more depending on the process.

In addition, the circuit of FIG. 5 requires a self calibrating operational amplifier for every current mirror MOS transistor. Yet another limitation of the circuit of FIG. 5 is that the current range is limited by the resistance used. As current increases, the voltage across the resistors increases, which limits the available output voltage.

Figure 6:
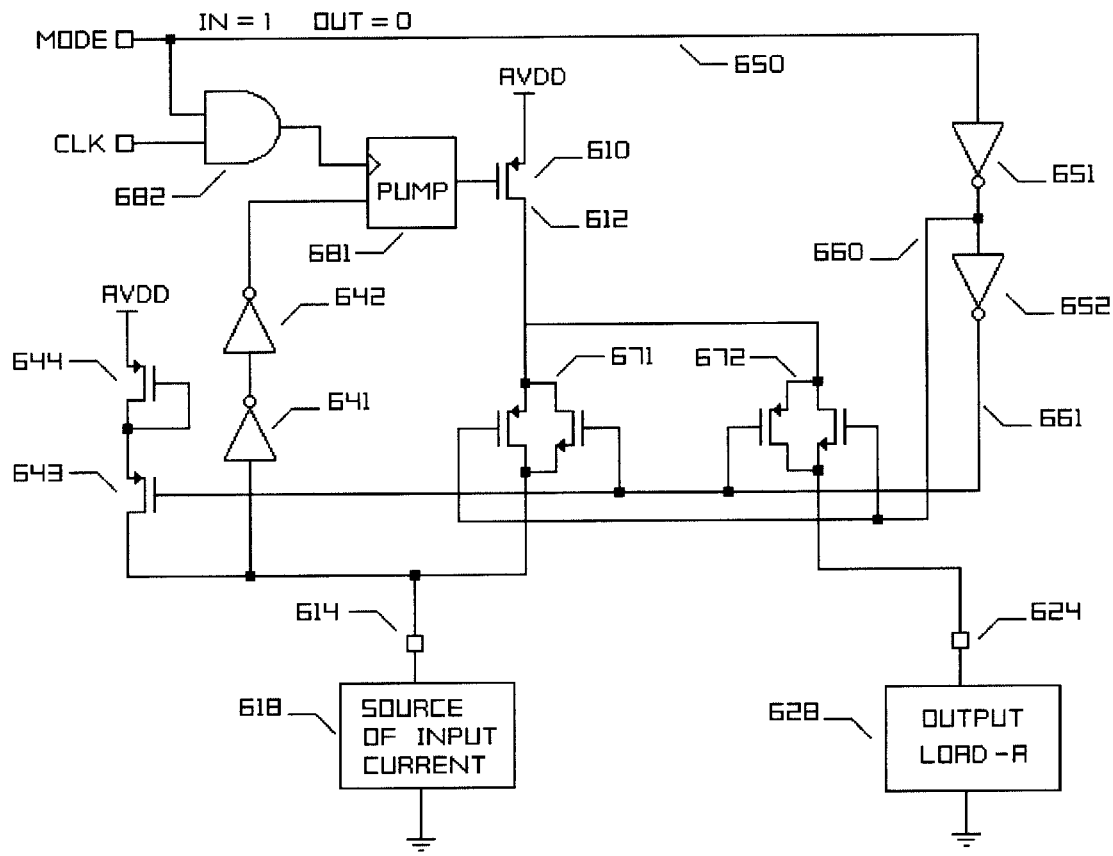
FIG. 6 is a schematic that shows a self calibrating current mirror using a single current mirror MOS transistor.

FIG. 6 discloses an embodiment that is another self calibrating current mirror that overcomes the limitations of FIG. 5. The circuit shown in FIG. 6 comprises a single current mirror MOS transistor 610, an input 614 for receiving current from a source of input current 618, a charge pump 681, a first transfer gate 671, a second transfer gate 672, and an output load connected to the current mirror output 624.

In addition the self calibrating current mirror of FIG. 6 also includes first, second, third and forth CMOS inverters 641, 642, 651 and 652 respectively. The circuit of FIG. 6 also includes a PMOS switch transistor 643, PMOS clamp transistor 644 and AND gate 682. The single current mirror MOS transistor 610 has a drain connected to the inputs of both transfer gates 671 and 672. The gate of the single current mirror MOS transistor is connected to the charge pump output. The source of the single current mirror transistor is connected to a power supply node. The output of the first transfer gate 671 is connected to the current mirror input terminal 614. The output of the second transfer gate 672 is connected to the current mirror output 624. The current mirror input is connected to the input of the first CMOS inverter 641. The output of second inverter 642 is connected to the input of charge pump 681. The self calibrating current mirror includes a first digital input MODE and a second digital input CLK both connected to the inputs on AND gate 682. In addition the MODE input is connected to the input of third inverter 651. The outputs of inverters 651 and 652 are connected to the control input of first and second transfer gates 671 and 672.

The self calibrating current mirror of FIG. 6 operates in the following manner. When the MODE input receives a logic 1 input signal, MODE=1, transfer gate 671 is on and transfer gate 672 is off. Then the current mirror input 614 is connected to the drain of single current mirror MOS transistor 610. The current mirror in MODE=1 does not produce an output current at 624, except for leakage. During MODE=1, AND gate 682 is enabled. As such charge pump 681 receives the applied clock signal CLK. The output of the charge pump 681 shall respond in incremental steps to the output of inverter 682, which follows the voltage on current mirror input 614. If the drain current of current mirror MOS transistor 610 is less than the input current applied to current mirror input 614, the voltage at 614 decreases. The output voltage of charge pump 681 shall, decrease in incremental steps, which increases the drain current of MOS transistor 610. The drain current of MOS transistor 610 shall continue to increase on successive pump intervals until the drain current matches the input current.

In a similar manner, when the drain current of MOS transistor 610 exceeds the applied input current at input terminal 614, the voltage at the input terminal increases. The output of inverter 642 produces a logic 1 output, which causes the output of charge pump 681 to increase in incremental steps. As such the drain current of MOS transistor 610 decreases until the drain current matches the applied input current. The structure of FIG. 6 in MODE=1 forms a discrete time negative feedback control loop.

When MODE=0, transfer gate 672 is on and transfer gate 671 is off. The AND gate 682 is deactivated, producing a logic 0 output to the clock input of charge pump 681. As such the output voltage of charge pump 681 is in a hold mode. The output of inverter 652 shall produce a logic 0 output that renders MOS transistor 643 conductive. The applied input current to current mirror input 614 has a conduction path to supply node AVDD through MOS transistor 644. MOS transistor 644 produces a clamp voltage. The current mirror MOS 610 transistor produces a drain current to the current mirror output 624. The gate voltage on MOS transistor 610 in MODE=0 is nearly identical to the gate voltage in MODE=1. As such, the drain current of MOS transistor 610 in MODE=0 is nearly equal to the drain current in MODE=1.

Figure 1:
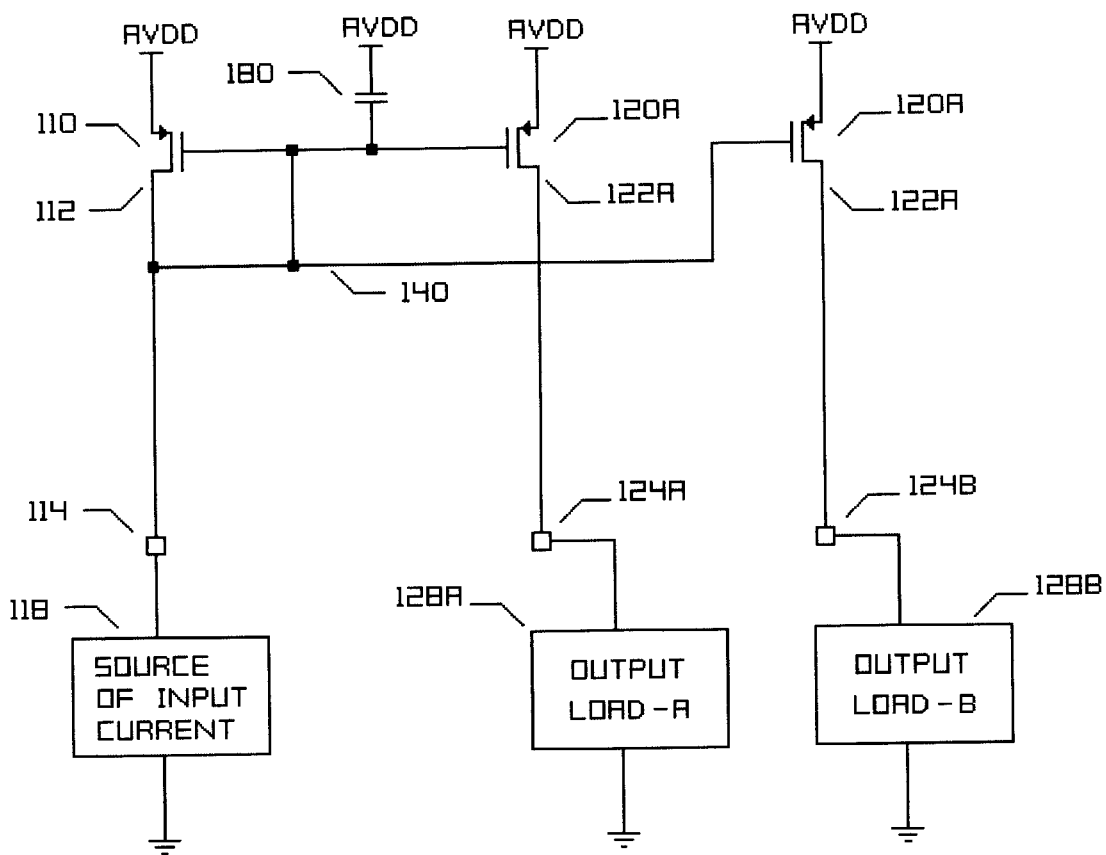
FIG. 1 labeled prior art, is a schematic of a simple MOS current mirror circuit.

The current mirror of FIG. 6 has a significant advantage over the conventional current mirror of FIG. 1. The current mirror of FIG. 1 uses two current mirror MOS transistors to replicate the input current. As such, a device mismatch occurs. In FIG. 6 only one current mirror MOS transistor exists. As such, there is no device mismatch. The gate bias voltage for the current mirror MOS transistor 610 is obtained in MODE=1. The same gate bias voltage is used in MODE=0 to bias the current mirror MOS transistor 610 to produce a drain current to the mirror output 624.

The current mirror of FIG. 6 shall produce an accurate output current if MOS transistor 610 has sufficient drain impedance. This is obtained by using sufficient gate length L. However, increasing the gate length limits the maximum drain current. The maximum drain current is limited by W/L (width/length). If length is increased, then increasing the width of MOS transistor 610 shall produce a larger drain current. The use of a cascode structure to replace the current mirror MOS transistor 610 shall increase the output impedance, but shall reduce the available voltage on the output 624.

Figure 7:
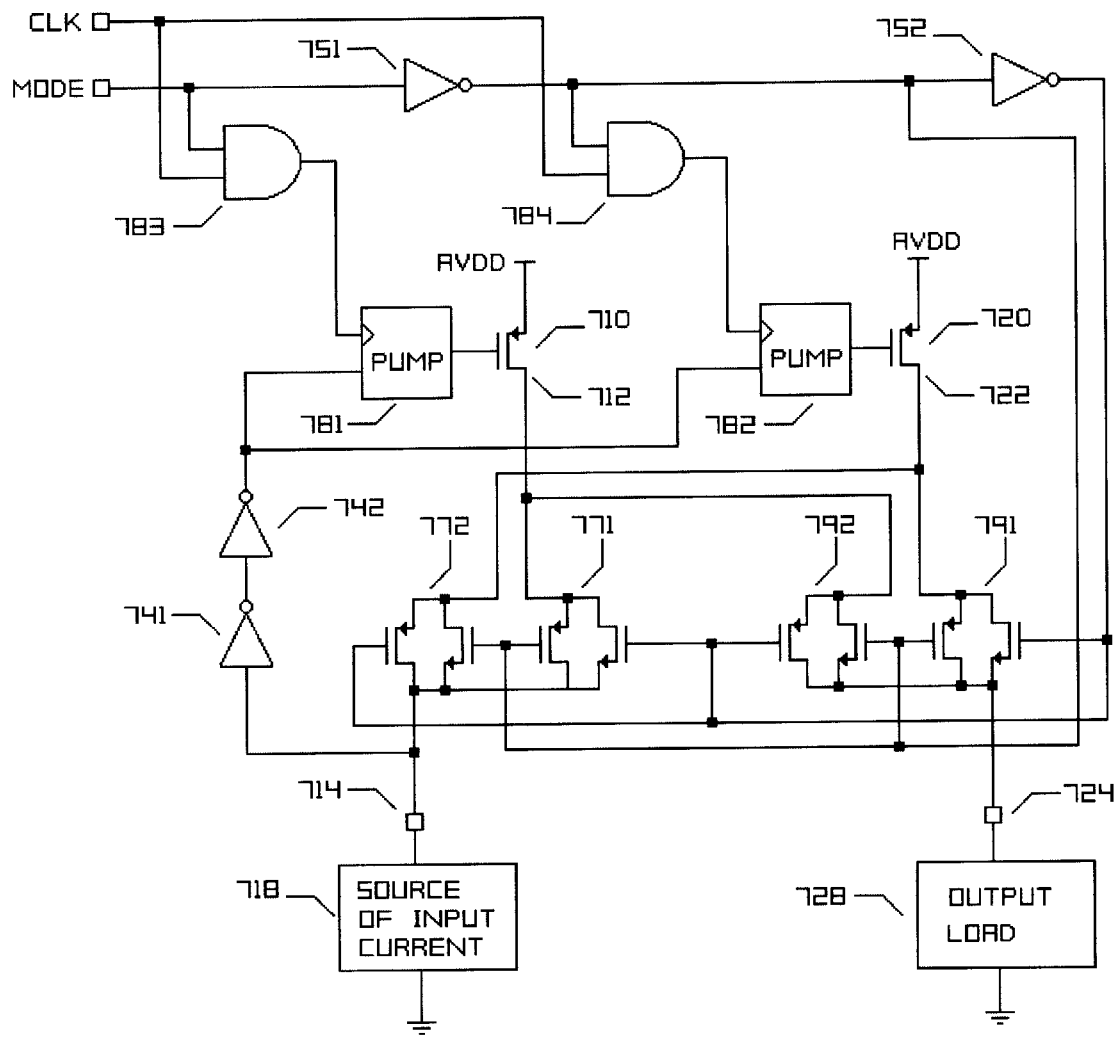
FIG. 7 is a schematic that shows a self calibrating current mirror using two current mirror MOS transistors.

Although very precise, the current mirror of FIG. 6 has a major disadvantage. The output current is not continuous. The structure of FIG. 6 provides an output current in MODE=0. In many applications the mirror output current is not required at all times. However, there are many applications when a continuous output current is required. The embodiment shown in FIG. 7 overcomes this limitation of FIG. 6. FIG. 7 discloses a continuous time self calibrating current mirror.

FIG. 7 is schematic diagram of a self calibrating current mirror that produces continuous output current at the current mirror output 724. FIG. 7 comprises two self calibrating current mirrors as shown by FIG. 6. Each of the two self calibrating current mirrors includes a current mirror MOS transistor, two transfer gates, a charge pump and a AND gate. The two self calibrating current mirrors operate in complimentry fashion, one operates in MODE=1 while the other operates in MODE=0.

The self calibrating current mirror of FIG. 7 comprises first and second current mirror MOS transistors 710 and 720, first and second charge pumps 781 and 782, and first and second AND gates 783 and 784. The current mirror of FIG. 7 also includes first, second, third and fourth transfer gates identified as 771, 772, 791 and 792 respectively. In addition, the self calibrating current mirror shown by FIG. 7 has a current mirror input 714 for receiving an input current, an output 724 for providing an output current, and inverters 741 and 742 for detecting a mismatch in the drain current of a current mirror MOS transistor and the input current applied to input 714.

The self calibrating current mirror of FIG. 7 operates in the following manner. In MODE=1, a logic 1 voltage is applied to the MODE input. Complimentary digital output signals from inverters 751 and 752 render transfer gates 771 and 791 on and transfer gates 772 and 792 off. In this state, the current mirror input 714 is connected to the drain of first current mirror MOS transistor 710. Also, in the MODE=1 state, the drain 722 of the second current mirror MOS transistor 720 is connected to current mirror output 724. As such, the current mirror output current is the drain current of MOS transistor 720.

In MODE=1, the current applied to the current mirror input 714 is passed to the drain of first current mirror MOS transistor 710. When the applied input current exceeds the drain current of transistor 710, the voltage at the current mirror input 714 decreases. The inverters 741 and 742 respond to the lower input voltage. Inverter 742 produces a logic 0 output at the input of charge pump 781. AND gate 783 passes the input CLK signal to the charge pump clock input. As such, charge pump 781 produces an incremental decreasing voltage to the gate of the current mirror MOS transistor 710. As the gate voltage decreases, the drain current of MOS transistor 710 increases. The gate voltage of MOS transistor 710 shall converge such that the drain current approaches the applied input current.

When the drain current of the current mirror MOS transistor 710 exceeds the applied input current, then the voltage at the input of inverter 741 increases. The output of inverter 742 produces a logic 1 output to the input of charge pump 781. Charge pump 781 produces an incremental increasing voltage to the gate of MOS transistor 710. The drain current of MOS transistor 710 decreases. The gate voltage of MOS transistor 710 shall converge such that drain current of current mirror MOS transistor approaches the applied input current.

In MODE=0, a logic 0 input is applied to the MODE input. Inverter 751 produces a logic 1 output, while inverter 752 produces a logic 0. As such transfer gates 772 and 792 are on while transfer gates 771 and 791 are off. In MODE=0 the drain 712 of the first current mirror MOS transistor is connected to the current mirror output 724. Also in mode 0, the drain 722 of the second current mirror MOS transistor 720 is connected to the current mirror input 714.

In MODE=0 the second current mirror MOS transistor 720 performs the identical function of first current mirror MOS transistor 710 in MODE=1. Likewise, in MODE=0 the current mirror MOS transistor 710 performs the identical function of the second current mirror MOS transistor 720 in MODE=1. In MODE=0 second charge pump 782 and AND gate 784 perform the identical functions of first charge pump 781 and AND gate 783 in MODE=1.

In MODE=0 the output voltage of second charge pump 782 increases incrementally, when the drain current of the second current mirror MOS transistor 720 exceeds the current applied to the current mirror input 714. As such the drain current of MOS transistor 720 decreases. In MODE=0 the output voltage of second charge pump 782 shall decrease incrementaly, when the drain current of the second current mirror MOS transistor 720 is less then the current applied to the current mirror input 714. As such, the drain current of second current mirror MOS transistor 720 increases.

In MODE=0 the drain current of second current mirror MOS transistor 720 increases or decreases to match the current applied to the current mirror input. In addition, the gate voltage of first current mirror MOS transistor 710 is retained by the output capacitor of the first charge pump 781. As such, the drain current of first current mirror MOS transistor 710 passes to the current mirror output 724.

The embodiment of a self calibrating current mirror as shown by FIG. 7 has a distinct advantage over the structure shown by FIG. 6. The advantage of FIG. 7 is that the current mirror output current is continuous. By using the two current mirror MOS transistors, one MOS transistor produces an output current while the other MOS transistor is being calibrated.

The current mirror of FIG. 7 shall produce an output current that is an accurate reproduction of the applied input current, provided that the current mirror MOS transistor have adequate gate length. As drain current increases, the W/L ratio must also increase to keep the gate voltage within supply range. As such, the area of the current mirror must increase.

Figure 8:
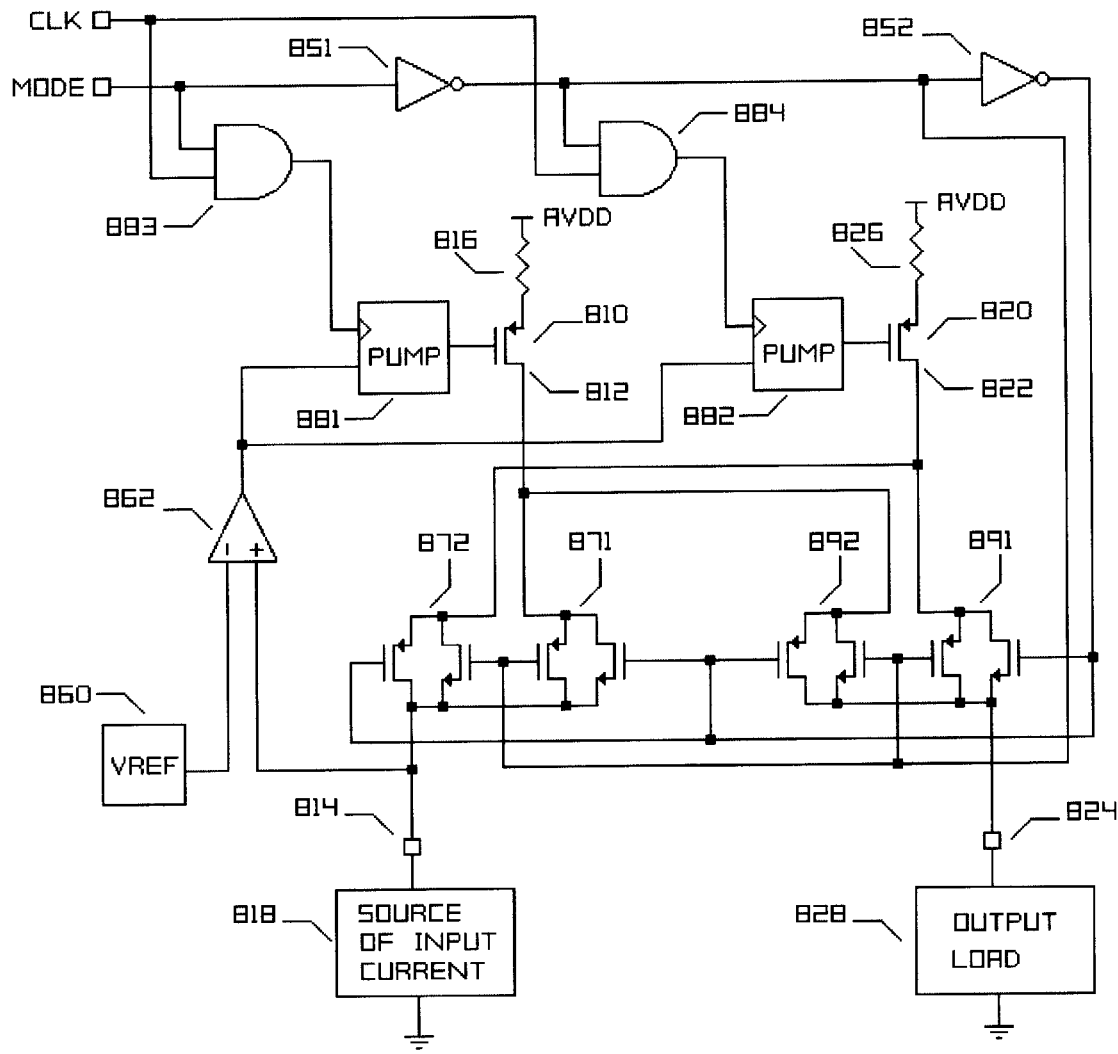
FIG. 8 is a drawing that discloses another embodiment of a self calibrating current mirror having increased output impedance using source resistors.

FIG. 8 discloses another embodiment of the invention. In FIG. 8, the first and second current mirror MOS transistor have a smaller gate length than in FIG. 7. As such, the required chip area of the of the current mirror MOS transistors are smaller. The circuit of FIG. 8 utilizes the same principal discussed in FIG. 3 to reduce the sensitivity of drain current to output voltage. However, the circuit of FIG. 8 has specific advantages over FIG. 3 and FIG. 7.

The self calibrating current mirror of FIG. 8 comprises a first current mirror MOS transistor 810, first charge pump 881, first AND gate 883 and first resistor 816. The self calibrating current mirror of FIG. 8 also comprises a second current mirror MOS transistor 820, second charge pump 882, second AND gate 884 and second resistor 826. The circuit of FIG. 8 also includes a first, second, third and fourth transfer gates, that are identified as 871, 872, 891 and 892 respectively. In addition the structure of FIG. 8 includes a voltage reference 860, a differential comparator 862, first inverter 851, second inverter 852, a current mirror input 814 and a current mirror output 824.

The output of the first charge pump 881 is connected to the gate of the first current mirror MOS transistor 810. The drain 812 of the first current mirror MOS transistor 810 is connected to the inputs of the first and fourth transfer gates 871 and 892. The output of the second charge pump 882 is connected the gate of second current mirror MOS transistor 820. The drain 822 of the second current mirror MOS transistor is connected to the inputs of second and third transfer gates 872 and 891. The output of voltage reference 860 is connected to the inverting input of differential comparator 862. The output of the comparator 862 is connected the directional inputs of first and second charge pumps 881 and 882. A digital MODE input is connected to the input of first inverter 851 and first AND gate 883. The output of the first inverter 851 is connected to the input of second inverter 852 and second AND gate 884. The outputs of first and second inverters provide the digital complimentary signals to the control input of the transfer gates 871, 872, 891 and 892. The current mirror input 814 is connected to the output of the first transfer gate 871 and also to the output of the second transfer gate 872. The current mirror output 824 is connected to the output of the third transfer gate 891 and to the output of the fourth transfer gate 892.

The operation of the self calibrating current mirror of FIG. 8 is identical to that described for FIG. 7. When MODE=1, the gate voltage of the first current mirror MOS transistor 810 is adjusted such that the drain current matches the applied input current. When MODE=0, the gate voltage of the second current mirror MOS transistor is adjusted such that the drain current matches the applied input current. In MODE=0 the drain of the first current mirror MOS transistor 810 is connected to the current mirror output 824. In MODE=1 the drain of second current mirror MOS transistor 820 is connected to the current mirror output 824.

Figure 3:
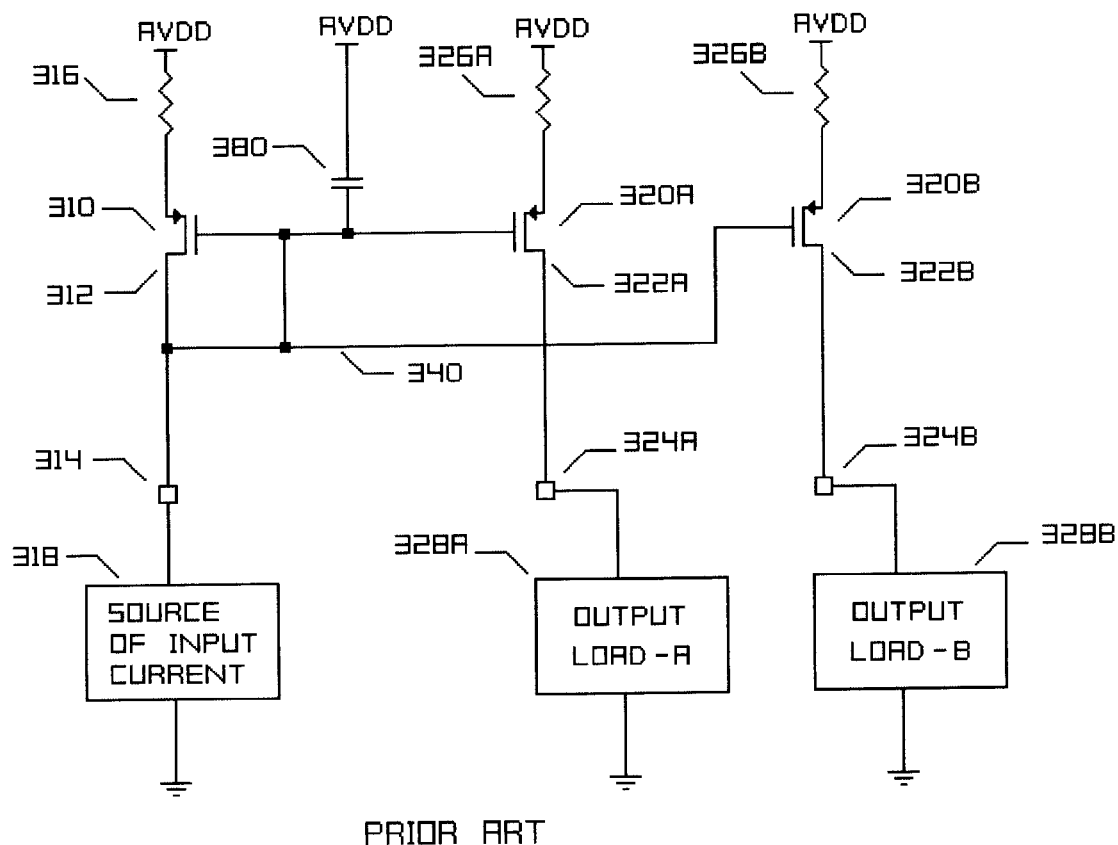
FIG. 3 labeled prior art, is a schematic of a MOS current mirror circuit that includes resistor elements to improve current matching.

The self calibrating current mirror of FIG. 8 provides distinct advantages over the circuit structure of both FIG. 3 and FIG. 7. The circuit shown in FIG. 8 has reduced sensitivity to changes in power supply voltage and load voltage. As power supply voltage increases or the load voltage decreases, a larger drain to source voltage occurs across the current mirror MOS transistor connected to the output. The increased voltage causes the depletion region of the drain to towards the source. As such, more drain current is produced for the same gate voltage. The change in gate voltage shall occur across the resistor connected to the source. The change in drain current Id is is the change in gate voltage Vgs divided by the resistance R. The resistors 816 and 826 increase the effective drain impedance of MOS transistors 810 and 820.

The gate lengths of the MOS transistors 810 and 820 can be reduced when the resistors 816 and 826 are increased. Minimum gate lengths for MOS transistors 810 and 820 and minimum resistor widths for resistors 816 and 826 are allowed without concern for the matching accuracy. The mismatch of device parameters for MOS transistors 810 and 820 and the resistors 816 and 826 are eliminated by self calibration. As such, in some cases the chip area of FIG. 8 is less than that of FIG. 7. In addition, the circuit of FIG. 8 allows the use of higher resistivity material such as P-well or N-well without regard to matching or to voltage sensitivity. Again, any non-linearity or mismatch in resistors 816 and 826 is eliminated by self calibration.

The circuit of FIG. 8 uses a comparator 862 and voltage reference 860 to perform the same operation of the first and second inverters 741 and 742 of FIG. 7.

The comparator 862 of FIG. 8 has a switching threshold voltage established by VREF 860. As such, the input 814 of self calibrating current mirror of FIG. 8 shall have a steady state input voltage nearly equal to VREF. Therefore, the source of input current 818 drives a nearly constant voltage. So the source of input current 818 produces almost no change in current at the current mirror input 814 as the power supply voltage changes.

Figure 9:
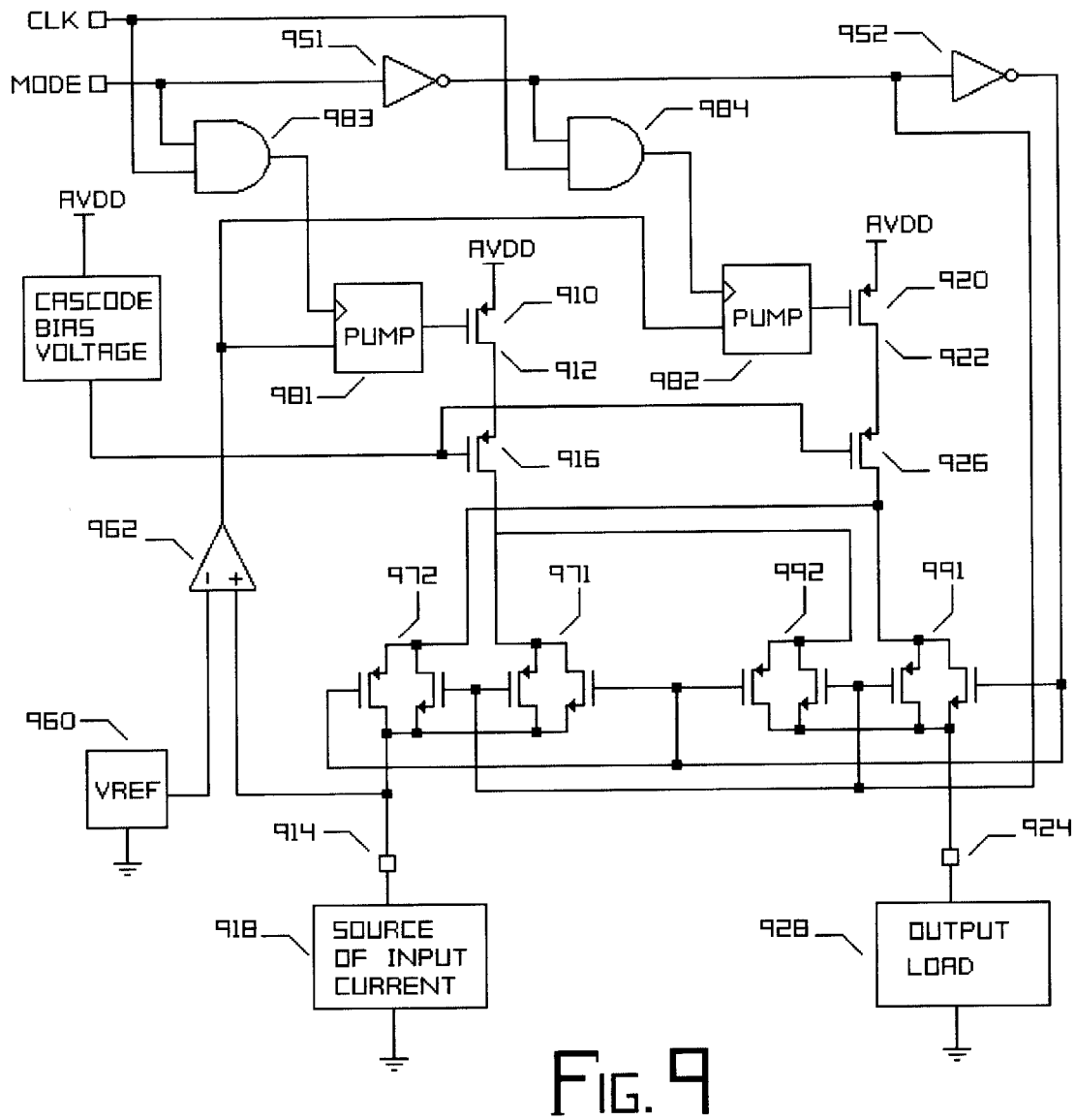
FIG. 9 is a diagram that illustrates an embodiment of the invention with increased output impedance using cascode transistors.

FIG. 9 discloses another embodiment of the invention. The circuit of FIG. 9 comprises first and second current mirror MOS transistors 910 and 920, first and second charge pumps 981 and 982, first and second AND gates 983 and 984, first and second inverters 951 and 952, and first and second cascode MOS transistors 916 and 926. In addition the current mirror of FIG. 9 includes first, second, third and fourth transfer gates 971, 972, 991 and 992, comparator 962, voltage reference 960, current mirror input 914 and current mirror output 924.

The self calibrating current mirror of FIG. 9 is identical to the structure and in operation as the circuit shown in FIG. 8, except that resistors 816 and 826 of FIG. 8 have been replaced with the cascode MOS transistors 916 and 926. The function of the cascode MOS transistors 916 and 926 is to provide increased output impedance to the current mirror output 924. The circuit of FIG. 9 has distinct advantages over circuit topologies of FIG. 2, FIG. 7 and FIG. 8.

Figure 2:
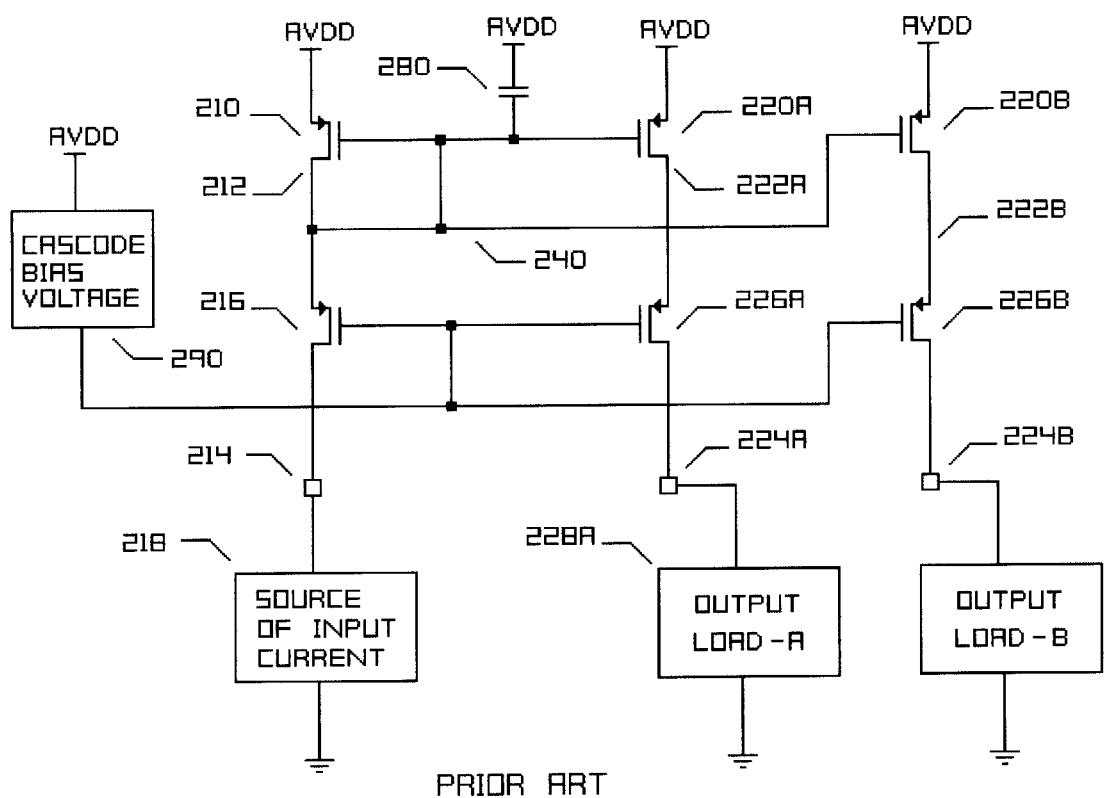
FIG. 2 labeled prior art, is a schematic of a simple MOS current mirror that includes cascoded output transistors to reduce sensitivity to changes in power supply voltage and load voltage.

Although the circuit of FIG. 2 has a high output impedance, the current mirror MOS transistors have device mismatches that produce an error in the current mirror output current. The current mirror of FIG. 7 is self calibrating. However, the circuit of FIG. 7 requires that the current mirror MOS transistors have large gate lengths L to obtain a reasonable high output impedance. As current increases, the W/L ratio must increase. Because L is large, the width W must also increase. The current mirror MOS transistors of FIG. 7 tend to be very large. The circuit of FIG. 8 uses resistors to increase output impedance. However, these resistors are useful only when an adequate voltage across the resistors occurs.

The circuit of FIG. 9 has the following features. The cascode MOS transistors 916 and 926 provide a high output impedance, reducing the sensitivity to power supply voltage and load voltage. The circuit of FIG. 9 is self calibrating. As such, errors due to device mismatches of the current mirror MOS transistors 910 and 920, and from mismatches of the cascode MOS transistors 916 and 926 are eliminated. In addition the circuit of FIG. 9 allows smaller gate lengths L and widths W to be used for MOS transistors 910, 920, 916 and 926 without regard for matching, because of self calibration. The circuit of FIG. 9 operates over a wide range of mirror current, because the resistors 816 and 826 of FIG. 8 have been replaced with cascode MOS transistors. The circuit of FIG. 9 operates with current mirror MOS transistors 910 and 920 operating in saturation or in the ohmic region. As such, the current mirror has a large operating voltage range.

Each of the various embodiments of the invention constitutes a self calibrating current mirror. Each embodiment has a current mirror input, a current mirror output, and means to calibrate the output current to match the applied input current. The invention eliminates the error in output current resulting from device mismatches. The invention is a current mirror having an output current that accurately replicates the input current.

The invention utilizes a charge pump circuit to calibrate and to hold the gate voltage of the current mirror MOS transistors. Such a charge pump has been fully described in U.S. Pat. No. 5,594,388. In FIG. 7C of U.S. Pat. No. 5,594,388 the charge pump comprises two transfer gates, each receiving complimentary control signal inputs. The transfer gates are connected such that one is conductive when the other is off. In addition, the charge pump includes a small capacitor and large capacitor used to produce small incremental voltage steps on the charge pump output.

Although the charge pump described in U.S. Pat. No. 5,594,388 is suitable for use in the present invention, it has certain limitations. The charge pump produces incremental voltage steps on the output in which the step size is given by equation (9).

$$Vstep = Csw/Cout\ [Vin - Vout] \quad (9)$$

The step size of the charge pump output voltage is dependent on the capacitance ratio and the pump voltage applied to the input of the charge pump. To obtain a small voltage step, Cout must increase. As Cout increases the chip area increases. If Cout is small, then the step size of the charge pump increases. As such, the accuracy of the current mirror output is limited by the step size of the charge pump output. If the charge pump step size is too large, then the current mirror input current shall not be accurately replicated.

Figure 10:
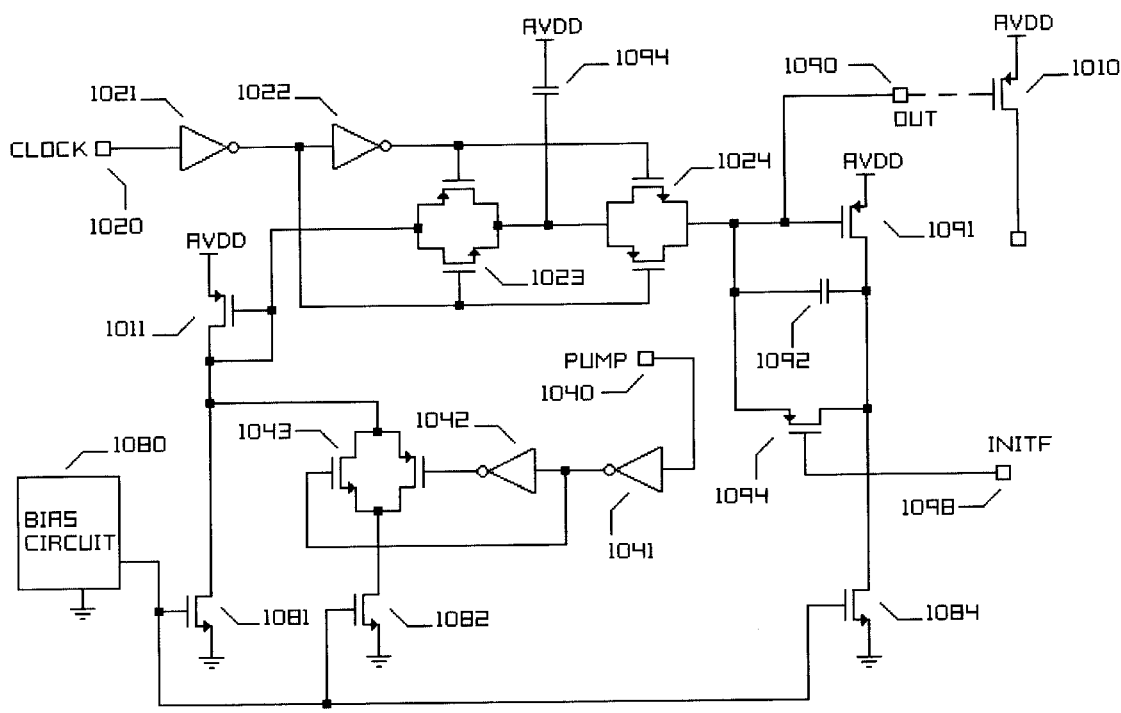
FIG. 10 is a schematic of a charge pump circuit that utilizes "Miller Effect" to reduce the step size of the output voltage of the charge pump.

FIG. 10 discloses the schematic of a charge pump circuit having a reduced step size output voltage. The reduced step size is obtained using Miller feedback capacitance and by using a restricted pump input voltage.

The charge pump shown by FIG. 10 includes a first digital input 1040 for receiving a pump input signal, a second digital input 1020 for receiving a clock signal, and an output 1090 connected to a current mirror MOS transistor 1010. In addition, the charge pump of FIG. 10 includes a bias circuit 1080 connected to the gates of first, second and third NMOS transistors 1081, 1082 and 1083 respectively. The drain of first NMOS transistor 1081 is connected to a diode connected PMOS transistor 1011. The second NMOS transistor 1082 is connected to the input of a transfer gate 1043. The output of the transfer gate 1043 is also connected to the diode connected PMOS transistor 1011. The transfer gate 1043 has complimentary control inputs connected to two inverters 1041 and 1042. The input of inverter 1041 is connected to the PUMP input 1040. The charge pump includes two transfer gates 1023 and 1024 connected in series between the gate of the diode connected PMOS transistor 1011 and the gate of a PMOS transistor 1091. The drain of PMOS transistor 1091 is connected to the drain of the third NMOS transistor 1084 to form an inverter. The control inputs of the two transfer gates 1023 and 1024 are connected to complimentary digital outputs of inverters 1021 and 1022. The input of inverter 1021 is the CLK input 1020. The charge pump of FIG. 10 also includes a first and second capacitor 1094 and 1092. The charge pump output 1090 is connected to the second capacitor 1092 and the output of transfer gate 1024. The first capacitor 1094 is connected to the common node between transfer gates 1023 and 1024.

The charge pump of FIG. 10 operates in the following manner. NMOS transistors 1081, 1082 and 1084 are designed using unit W/L segments that are ratioed using integer multipliers m1, m2 and m4 respectively. The gates of NMOS transistors 1081, 1082 and 1084 are connected to the output of the bias circuit 1080. As such the drain currents of NMOS transistors 1081, 1082 and 1084 are proportional to m1, m2 and m4. The bias circuit is designed so that the drain current of the NMOS transistor 1081 shall be less than the steady state minimum drain current of the current mirror MOS transistor 1010. The ratio of m2/m1 is designed such that m2/m1 times the drain current of NMOS transistor 1081 shall be greater than the steady state current of MOS transistor 1010. The ratio of m4/m1 is designed such that the average drain current of 1084 is the average steady state drain current of current mirror MOS transistor 1010.

The digital input PUMP selects the drain current of MOS transistor 1011. The MOS transistor 1011 is diode connected. As such the voltage swing at the drain of MOS transistor 1011 is limited by the square law diode clamping. Capacitor 1094 is charged to the drain voltage of MOS device 1011 when the digital input CLOCK 1020 is low. The drain voltage of MOS transistor 1011 has limited dynamic range of perhaps 0.2 volts or less. When the CLOCK input is high, capacitor 1094 is connected to to capacitor 1092 by transfer gate 1024.

The drain of PMOS transistor 1091 is connected to the drain of NMOS transistor 1084 to form an inverter. Capacitor 1092 is connected from the input to the output of the inverter. As such a Miller capacitance occurs at the gate of PMOS transistor 1091. For a voltage gain of minus 10, a capacitance of 0.1 pf for capacitor 1094 and 20 for the capacitor 1092, a voltage step of less than 100 microvolts shall be produced at the charge pump output 1090.

The purpose of the charge pump in the various embodiments of the self calibrating current mirrors is to provide an incremental voltage step to the gate of a current mirror MOS transistor. The smaller the voltage step, the more precise the current mirror output current will replicate the input current. The charge pump of FIG. 10 uses Miller feedback capacitance and a restricted voltage range to provide a reduced voltage step. The charge pump of FIG. 10 is extremely well suited as a charge pump in a self calibrating current mirror.

The charge pump of FIG. 10 has such a small voltage step, a very long interval of time shall be required for the current mirror to settle. To reduce the settling time of the charge pump, the feedback capacitor 1092 is precharge by rendering the MOS transistor 1094 conductive. MOS transistor 1098 is rendered conductive by a logic 0 input voltage being applied to the INITF input 1098. The INITF input must be at a logic 1 voltage during the steady state operation of the charge pump.

As stated previously, prior art switched current digital to analog converters (DACs) comprise an array of MOS transistors connected as a multiple output current mirror. The device mismatch of the current mirror transistors in the DAC produce differential non-linearity error (DNL), intergral non-linearity error (INL), and full scale error. To reduce DNL, prior art current DACs must utilize a fully decoded unit current structure instead of binary weighted current structure. The fully decoded unit current structure requires more chip area. In addition to reduce INL, the DAC must use geometric layout techniques such as common centroid to reduce the effects of process gradients. Again, this requires additional chip area.

The device mismatch also produces full scale error. In a switched current DAC comprising conventional current mirror structures, the full scale error is given by equation (7). The full scale error is often 2 per cent or more. In a 10 bit DAC, a 2 per cent full scale error is equal to 8 LSB code steps. As such, the utility of 10 bit DAC is perhaps somewhat limited, because at codes near full scale an uncertainty of 16 codes exists. To guarantee a full scale current is obtainable, the DAC must be designed to produce the full scale current with a worst case negative error, i.e. −2 per cent. However, if the DAC has a worst case positive error, the DAC produces the full scale output with a positive 4 per cent error. In certain applications such as instrumentation, these errors are unacceptable.

Figure 11:
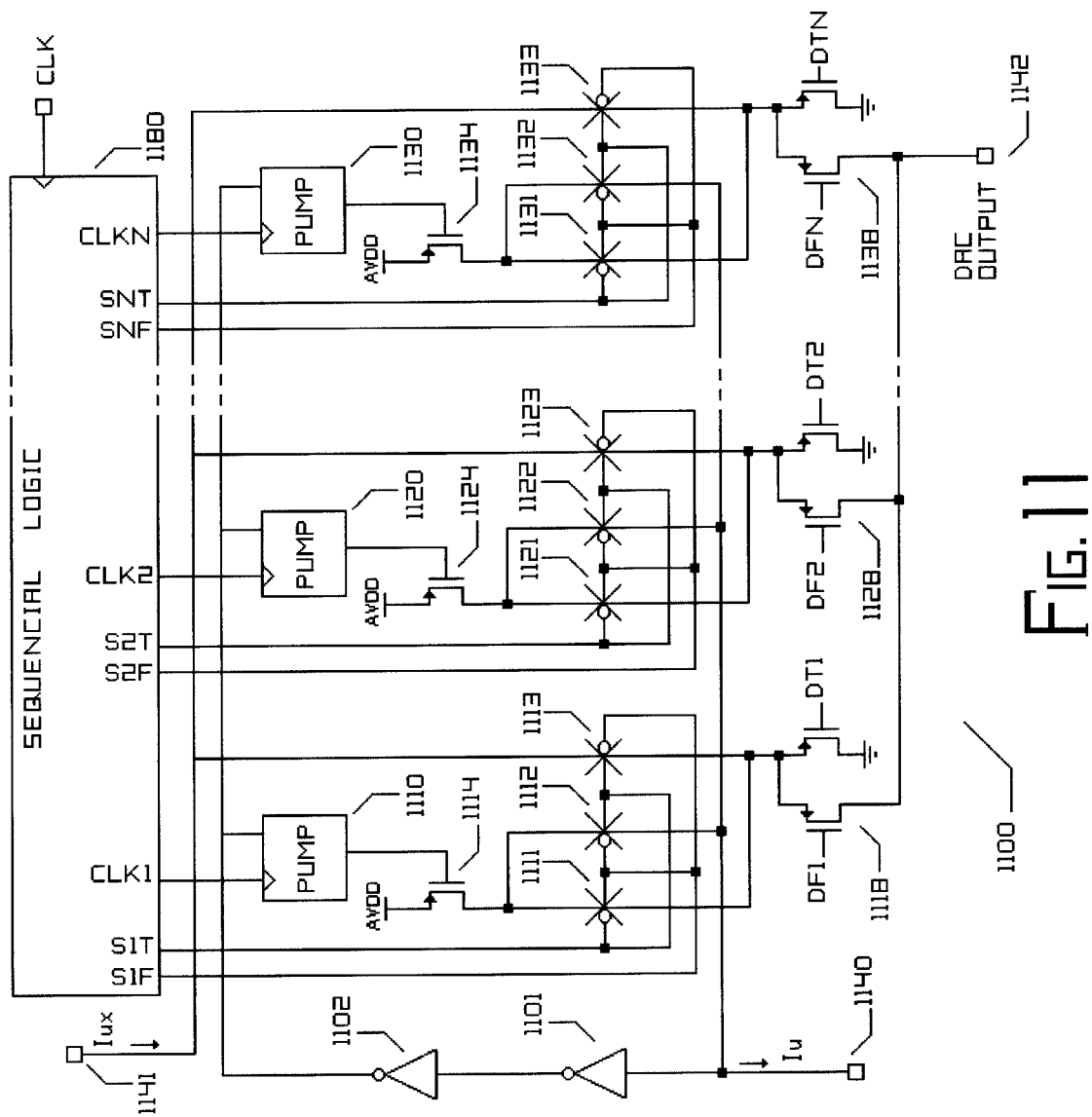
FIG. 11 is a schematic that illustrates another embodiment of the invention using multiple current mirror stages as a switched current digital to analog converter (DAC).

FIG. 11 discloses a high precision switched current DAC. The DAC disclosed by FIG. 11 is a self calibrating current mirror with multiple outputs, that are switched to the DAC output terminal. Because the DAC output current is a selected combination of outputs from the self calibrating current mirror, the DNL, INL and full scale errors are extremely small. The DAC of FIG. 11 has superior accuracy over prior art switched current DACs.

The DAC of FIG. 11 comprises an input for receiving an input current, a DAC output, an array of charge pumps, an array of current mirror MOS transistors, an array of transfer gates used for switching the current mirror MOS transistors from output mode to input mode for calibration, sequential control logic used for selecting and calibrating individual current mirror MOS transistors, and an array of differential current switches for switching the drain currents of the current mirror MOS transistors to the DAC output.

FIG. 11 discloses a switched current DAC 1100. The DAC 1100 has input 1140 for receiving an input current Iu. The DAC input 1140 is connected to the input of first inverter 1101. The output of inverter 1101 is connected to the input of second inverter 1102. The output of second inverter 1102 drives the PUMP inputs of the charge pumps that are identified as 1110, 1120 and 1130. A sequential logic circuit 1180 produces the digital output signals CLK1, CLK2, CLKN in response to a digital input signal CLK. The digital output signals CLK1, CLK2 and CLKN of the sequential logic circuit 1180 are clock input signals to the charge pumps 1110, 1120 and 1130 respectively. The output of the charge pump circuits 1110, 1120, and 1130 are connected to the gates of the current mirror MOS transistors 1114, 1124 and 1134 respectively. The sequential logic circuit 1180 also produces digital output signals S1T, S1F, S2T, S2F, SNT, and SNF. These digital outputs are connected to the transfer gates indicated as 1111, 1112, 1113, 1121, 1122, 1123, 1131, 1132 and 1113. The drain of each current mirror MOS transistor 1114, 1124 and 1134 is connected to the analog input of a transfer gates 1111, 1121 and 1131 respectively. In addition, the drain of each current mirror MOS transistor is connected to the analog input of a second transfer gate 1112, 1122 and 1132 respectively. The analog outputs of transfer gates 1111, 1121 and 1131 are each connected to a corresponding differential current switch indicated as 1118, 1128 and 1138 respectively. Each differential current switch 1118, 1128 and 1138 has two outputs. The first output is connected to the DAC output 1142. The second output is connected ground. The analog inputs of the transfer gates 1113, 1123 and 1133 are connected to a common input node 1141 for receiving a supplimental input current Iux.

The switched current DAC 1100 of FIG. 11 operates in the following manner. The sequential logic circuit 1180 receives a digital periodic timing signal CLK. The sequential logic circuit responds by producing a series of sequential digital signals. During a specific interval of time, a logic 1 output is asserted at S1T and a logic 0 is asserted at S1F. As such the transfer gate 1111 is rendered off and transfer gates 1112 and 1113 are conductive. In this state the drain of the current mirror MOS transistor 1114 is connected to the DAC input 1140 that receives an input current Iu. If the drain current of current mirror MOS transistor exceeds Iu, the input of inverter 1101 shall exceed the input switching threshold voltage of the inverter. As such the output of inverter 1102 shall be at a logic 1. The sequential logic circuit 1180 shall produce a low to high and a high to low transition on CLK1 during the time interval S1T is true. The charge pump 1110 shall produce an incremental increase in the gate voltage of current mirror MOS transistor 1114. As such the drain current shall decrease. Likewise, if the drain current of current mirror MOS transistor 1114 is less than the input current applied at 1140, the charge pump output shall produce an incremental decrease in the gate voltage. At the end of the calibration interval S1T transitions to a logic 0 and S2T transitions to a logic 1. When S1T transitions to a logic 0, transfer gate 1111 is conductive and transfer gates 1112 and 1113 are off. The drain of current mirror MOS transistor 1114 is connected to the input of differential current switch 1118. When the digital input signal DT1 transitions from low to high, the drain current of current mirror MOS transistor passes to the DAC output 1142. If the digital input signal DT1 is low, the drain current is passed to ground.

The DAC of FIG. 11 provides an incremental adjustment in the gate voltage of a selected current mirror MOS transistor as determined by the state of the sequential logic circuit 1180. All other current mirror MOS transistors not selected by the sequential logic circuit for calibration are active current source elements of the DAC. The DAC of FIG. 11 also includes an input 1141 Iux for receiving an input current. When a specific current mirror MOS transistor is selected for calibration, the input current Iux is then passed by a transfer gate to the corresponding differential current switch. As such, calibration of a current source MOS transistor appears "transparent" to the operation of the DAC.

The input current Iux applied at the input 1141 is obtained using one of the following techniques. Iux is duplicated using a conventional current mirror circuit. Iux is duplicated using a self calibrating current mirror is as described in this application. Iux is obtained by connecting the gate of an extra current mirror MOS transistor to one of the charge pump outputs in FIG. 11. The last technique provides a a reasonably accurate Iux for a very simple circuit. By referring to FIG. 11, Iux is obtained by using a current mirror MOS transistor 1114X (not shown) that is matched in layout to current mirror MOS transistor 1114. The gate of current mirror MOS transistor 1114X is connected to the output of charge pump 1110. The drain of current mirror MOS transistor 1114X is connected to the Iux input 1141. The Iux obtained by this technique is accurate to within 2 per cent of Iu for a VT error of 10 mV and for (Vgs−VT) of 1.0 volt. It shall be shown that the DAC of FIG. 11 with the Iux obtained in this manner has superior accuracy performance.

The DAC shown by FIG. 11 comprises N stages of self calibrating current mirror outputs. Each stage further comprises a charge pump, a current mirror MOS transistor, a differential current switch and three transfer gates. FIG. 11 shows three stages. However, FIG. 11 also includes elements having broken segments, which indicate that numerous elements are repeated. Charge pump 1130 of FIG. 11 is the charge pump of the Nth DAC stage. Differential current switch 1138 is the differential current switch for the Nth DAC stage. For a 10 bit DAC there are 1023 stages.

In most prior art digital to analog converters, the DAC often has a specified DNL, INL and full scale error. In general, a DNL greater than 1 LSB is considered unacceptable because the DAC then might not be monotonic. A DAC having a DNL error less than 1 LSB is guaranteed to be monotonic. Often DACs are specified with a maximum DNL of 0.5 LSB. A DAC having a INL error greater than 1 LSB has a worst case error that exceeds 1 code within the conversion range. As such that DAC has an error that renders the least significant bit meaningless as far as its exact value is concerned. Most DACs have a maximum specified INL error of 1 LSB. However, many high resolution DACs, having resolution greater than 12 bits have a maximum INL of 2 LSB or more. Very often the full scale error of switched current DACs are specified at 2 per cent.

The DAC of FIG. 11 using an Iux with a current source MOS transistor 1114X as described would have a DNL of 0.02 LSB. The INL for the DAC of FIG. 11 is the error resulting from the charge pump resolution for N stages. Assuming that this error is randomly distributed, the total expected error is the charge pump error multiplied by the square root of N plus DNL. A worst case INL error of 0.05 LSB is obtainable.

The DAC of FIG. 11 has a full scale error nearly equal to the INL. As such the full scale error of a 10 bit DAC is less than 0.05 LSB. When the resolution increases by 2 bits the INL doubles. As such a 14 bit DAC would have an INL of less than 0.1 LSB and a 16 bit DAC would have an INL and full scale error of less than 0.2 LSB. Such performance far exceeds prior art performance for switched current DACs.

Figure 12:
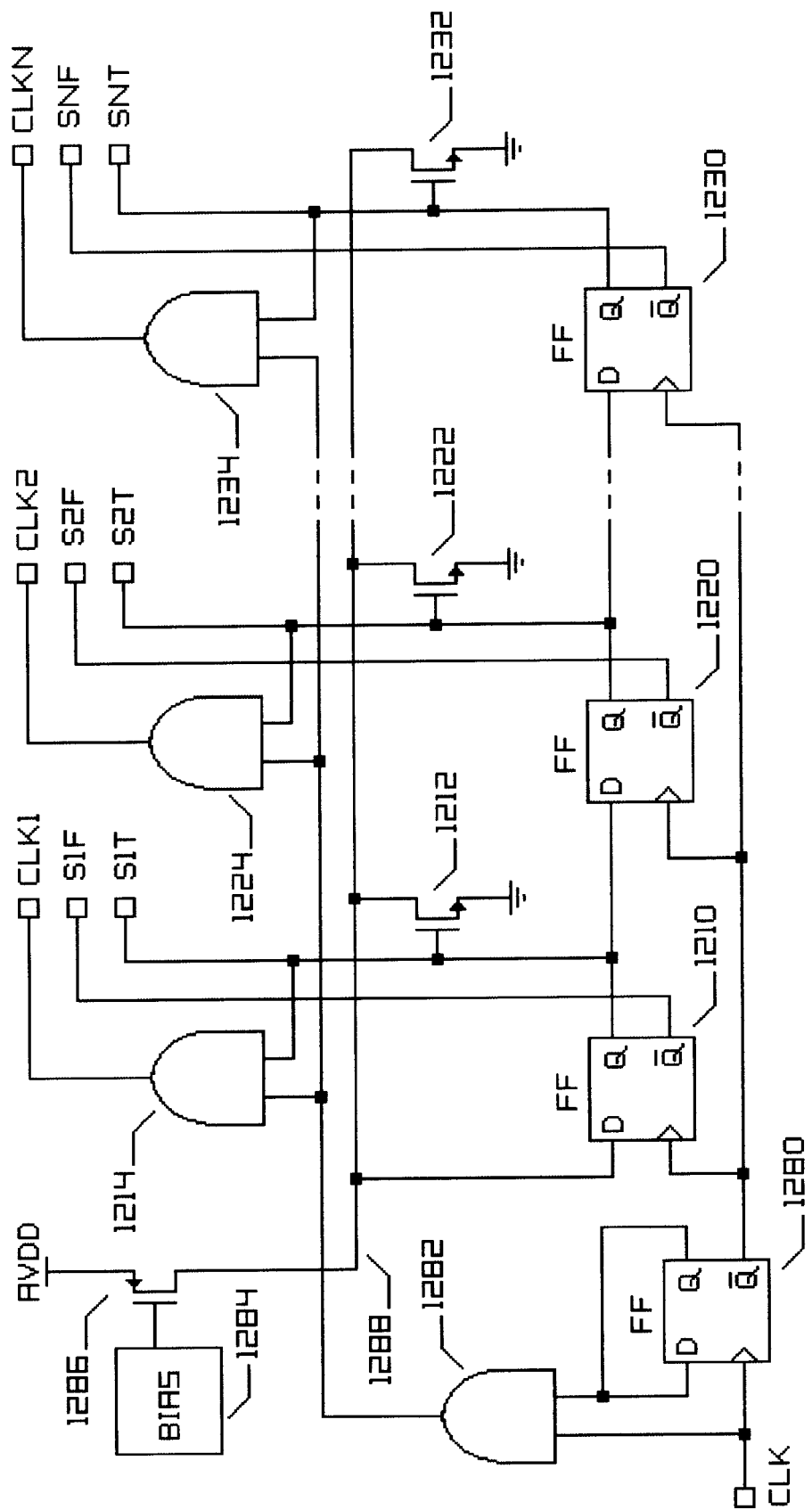
FIG. 12 is a schematic that shows more detail of the sequential logic used in FIG. 11.

FIG. 12 discloses an embodiment of the sequential logic circuit 1180 of FIG. 11. The sequential logic circuit of FIG. 12 comprises a plurality of N stages corresponding to the number of DAC stages in FIG. 11. Each stage includes a flip-flop, a two input AND gate, and an NMOS transistor used to form an N input NOR gate. FIG. 12 discloses a first stage having a first flip-flop 1210, a first AND gate 1214 and a first NMOS transistor 1212. FIG. 12 also discloses a second stage having a second flip-flop 1220, second AND gate 1224 and a second NMOS transistor 1222. FIG. 12 also discloses an Nth stage having an Nth flip-flop 1230, an Nth AND gate 1234 and a Nth NMOS transistor 1232. The sequential logic circuit of FIG. 12 also includes a common connection 1288 to interconnect the drains of the NMOS transistors of each stage. The common drain connection is connected to a PMOS transistor used to provide a source of current to pull up the common drain connection 1288. FIG. 12 also has a CLK input for receiving a a clock signal having an input frequency, and a flip-flop connected to divide the input frequency by two. The gate of PMOS transistor 1286 is connected to a bias circuit 1284 to produce a suitable drain current to operate the N input NOR gate.

The sequential logic circuit of FIG. 12 operates in the following manner. The chain of N flip-flops indicated by 1210, 1220 and 1230 forms a serial shift register. The output 1288 of the NOR gate formed by the NMOS transistors produce a logic 0 output whenever any input is at logic 1. As such the D input of the first flip-flop 1210 is held at logic 0 as long as any Q output of the shift register is at logic 1. The shift register shall have only a single logic 1 output that shifts to the next flip-flop stage during every other clock interval. After the SNT output is at logic 1, the shift register shall clear and all Q outputs shall be logic 0. The NOR gate output 1288 shall transition to a logic 1. It is observed that the sequential logic circuit shall produce an output S1T=1, followed by S2T=1 and so on until SNT=1.

During each interval, the corresponding AND gate is activated. The flip-flop 1280 produces both a high and a low output during each interval. The output of the AND gate 1282 transitions to a logic 1 when the CLK input is high and the Q output of flip-flop 1280 is low. As such, during the interval S1T=1, the CLK1 output shall transition from logic 0 to logic 1, and from logic 1 to logic 0. The CLK1 output transitions occurs without any overlap into any other intervals. The CLK2 output occurs in sequence during the S2T=1 interval, and so on until a CLKN output occurs during the SNT=1 interval. As such, the sequential logic circuit shown in FIG. 12 produces the digital signals required to operate the DAC of FIG. 11.

The DAC of FIG. 11 is very precise. However, the DAC of FIG. 11 also has an enormous degree of circuit complexity as the resolution increases. For a 10 bit DAC, 1023 self calibrating stages are required. The circuit complexity of the DAC shall be significantly reduced by using the structure shown by FIG. 13.

Figure 13:
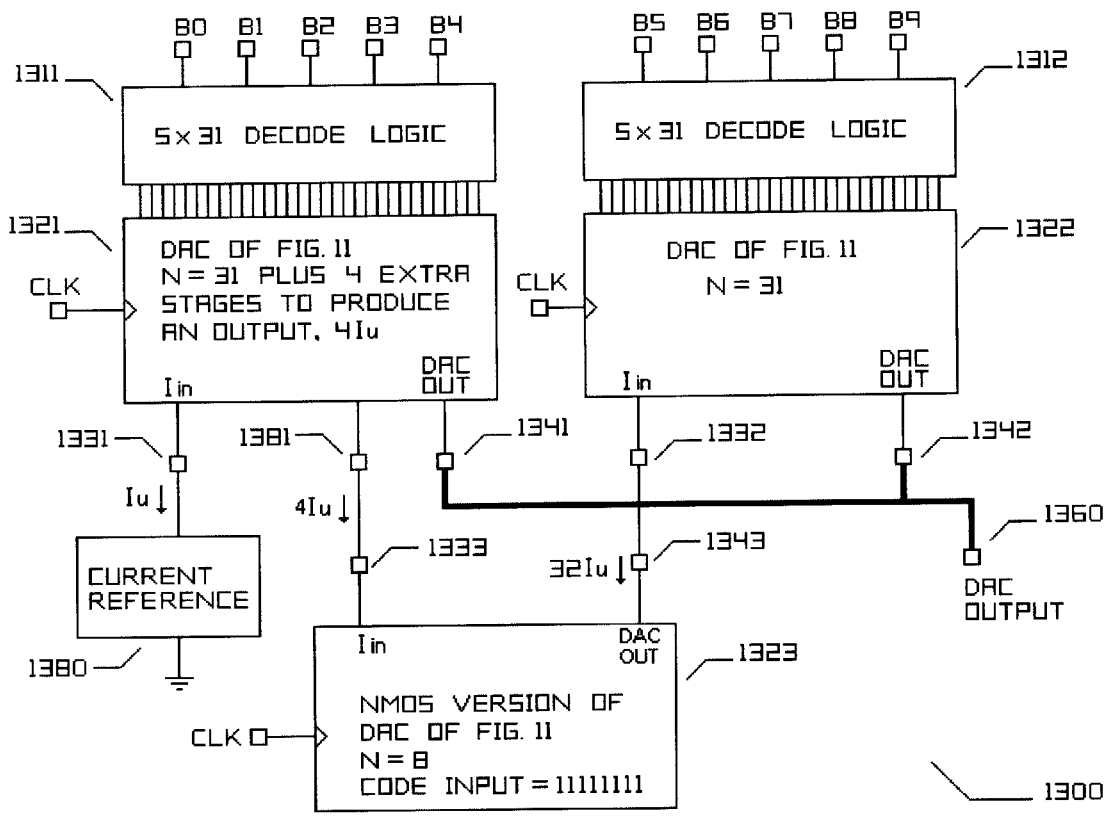
FIG. 13 is a schematic that discloses a high resolution 10 bit digital to analog converter (DAC) that utilizes multiple DAC structures of FIG. 11 to obtain low valued binary currents and high valued binary currents.

The DAC of FIG. 13 comprises a first DAC 1321, a second DAC 1322 and a third DAC 1323. The first and second DAC are PMOS DACs as shown in FIG. 11. The third DAC 1323 is an NMOS version of the PMOS DAC that is shown in FIG. 11. The structure shown by FIG. 13 also includes a first decode logic circuit 1311 and second decode logic circuit 1312. The outputs of the first decode logic circuit 1311 are connected to the D inputs of the first DAC 1321. The outputs of the second decode logic circuit 1312 are connected to the D inputs of the second DAC 1322. The DAC of FIG. 13 includes the digital inputs indicated as B0 through B9. The inputs B0 through B4 are connected to the inputs of first decode logic circuit 1311. The inputs B5 through B9 are connected to second decode logic circuit 1312. The first second and third DACs each have a CLK input for receiving a timing signal. All CLK inputs are connected to the same clock input signal.

A current reference 1380 is connected to the current input Iin 1331 of the first DAC 1321. The first DAC 1321 includes 31 self calibrating current mirror stages used as switched current DAC stages, and 4 extra self calibrating mirror stages. The output of the 4 extra stages are connected to a common node 1381. The current 4 Iu from 1381 of the first DAC 1320 is used as a reference current to the Iin input 1333 of the third DAC 1323. The output 1343 of the third DAC 1323 is connected to the current input Iin 1332 of the second DAC 1322. The outputs of the first DAC 1341 and second DAC 1342 are connected together as a common DAC output 1360.

The DAC shown by FIG. 13 operates in the following manner. An input code is applied to the digital inputs B0 to B9. The first and second decode logic circuits 1311 and 1312 produce digital output signals in response to the applied input signals B0 to B9. Each of the digital logic circuits produce output signals having the number of logic 1 outputs corresponding to the binary input code. For example, for the binary code input B0 to B4 of 1001, the output of the first decode logic circuit would be 1111111110000000000000000000, or 9 logic 1 s and 22 logic 0 s.

The outputs of the first and second decode logic circuits activate the differential current switches in the first DAC 1321 and the second DAC 1322. A logic 1 activates a differential current switch to switch the self calibrating current mirror current to the DAC output 1360.

Meanwhile, the CLK input is activated by the periodic timing signal that is applied to it. The self calibrating current mirror stages in the first DAC 1321 are calibrated to replicated the input current applied to the Iin input at 1331. The applied input current Iu is produced by the current reference 1380. As such, each code step of the first DAC 1321 produces a corresponding output current that is a very precise replica of the input current Iu. In addition, the first DAC 1321 also produces an output current at 1381 of 4 Iu, which is applied to the current input Iin 1333 of the third DAC 1323. The third DAC 1323 has a fixed digital input. The third DAC shall multiply the input current of 4 Iu applied at the current input 1333 by 8. The DAC OUT output 1343 of the third DAC produces a very precise fixed steady state current of 32 Iu. The output current of the third DAC 1323 is applied to the Iin input 1332 of the second DAC 1322.

As such, the second DAC 1322 has a reference input current of 32 Iu. Each current step produced by the second DAC has a very precise value of 32 Iu.

The output current of the DAC 1300 at the DAC OUTPUT 1360 is the combined output current of the first DAC 1321 and the second DAC 1322. As such, the output current of DAC 1300 has a very precise value of the numerical value of the input code times the unit current Iu. The DAC 1300 produces 31 times 32 plus 31 steps of current for a total of 1023 steps or 1024 levels. The DAC 1300 requires a total of 74 self calibrating current mirror stages, 35 stages in the first DAC 1321, 31 stages in the second DAC 1322, and 8 in the third DAC 1323.

Figure 14:
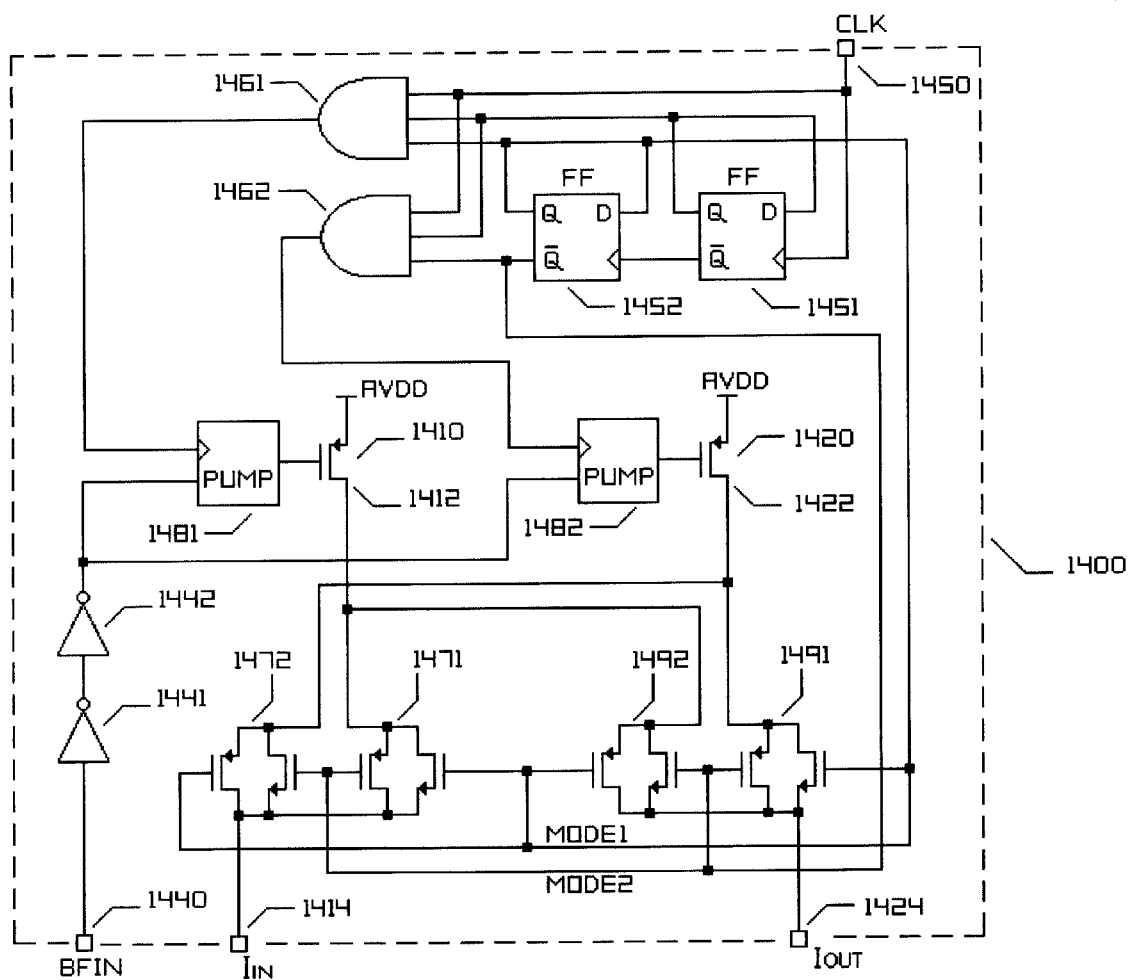
FIG. 14 is a schematic that discloses a multiple purpose self calibrating current mirror module having a digital control input for receiving a clock signal, an input current terminal, an output current terminal and a feedback input terminal.

FIG. 14 discloses another embodiment of a self calibrating current mirror. FIG. 14 is a schematic diagram of a self calibrating current mirror module. Current mirror module 1400 comprises a first current mirror MOS transistor 1410, second current mirror MOS transistor 1420, first charge pump 1412, second charge pump 1422, first inverter 1441, second inverter 1442, an input Iin 1414 for receiving an input current and an output Iout 1424 for providing an output current to a load. In addition the self calibrating current mirror module includes first, second, third and fourth transfer gates identified as 1471, 1472, 1491 and 1492 respectively. The module 1400 also includes a first flip-flop 1451 having a clock input connected to a CLK input 1450, a second flip-flop 1452 having a clock input connected to the Q output of the first flip-flop 1451, first AND gate 1461 and second AND gate 1462.

The self calibrating current mirror module operates in a similar manner as described for FIG. 7. In FIG. 14 the AND gates 1461 and 1462 and the flip-flops 1451 and 1452 provide the timing signals to the transfer gates and the CLK inputs of the charge pumps. Self calibrating current mirror module 1400 also has a generic input FBIN, that is Used to control the pump polarity of the charge pumps 1481 and 1482.

The self calibrating current mirror module 1400 is well suited for numerous applications. The general purpose generic input FBIN allows the module to operate with a digital or analog comparator. In certain applications the inverters 1441 and 1442 have sufficient gain that the FBIN input 1440 shall operate as comparator input. The module 1400 requires only a digital periodic timing signal to be applied to the CLK input 1450.

The self calibrating current mirror module 1400 operates in the following manner. A periodic digital timing signal is applied to the CLK input 1450. First flip-flop 1451 changes state on every positive clock transition applied to the CLK input. The second flip-flop 1452 changes state on every positive transition of the Q output of first flip-flop 1451. The first AND gate 1461 produces a positive pulse when when the Q output of second flip-flop 1452 is low. The second AND gate 1462 produces a positive pulse when the Q output of second flip-flop 1452 is high. As such the clock input of the first charge pump 1481 receives a positive pulse during the time interval that transfer gates 1471 and 1491 are conductive. Charge pump 1481 produces an incremental increase or decrease in voltage in response to the FBIN input voltage. During the interval when transfer gate 1471 is conductive, the drain 1412 of the first current mirror MOS transistor is connected to the current mirror input Iin 1414. Likewise, when transfer gates 1472 and 1492 are conductive, the drain 1422 of the second current mirror MOS transistor is connected to the current mirror input Iin 1414. During that interval when transfer gate 1472 is conductive, the clock input of the second charge pump 1482 receives a positive pulse from the second AND gate 1462.

The self calibrating current mirror module 1400 of FIG. 14 has automatic self calibration when a periodic timing signal is applied to the CLK input. If the FBIN input 1440 is connected to the current mirror current input Iin 1414, the module 1400 shall respond as a a current mirror. The current mirror output 1424 shall replicate the input current applied to the input Iin.

Figure 15:
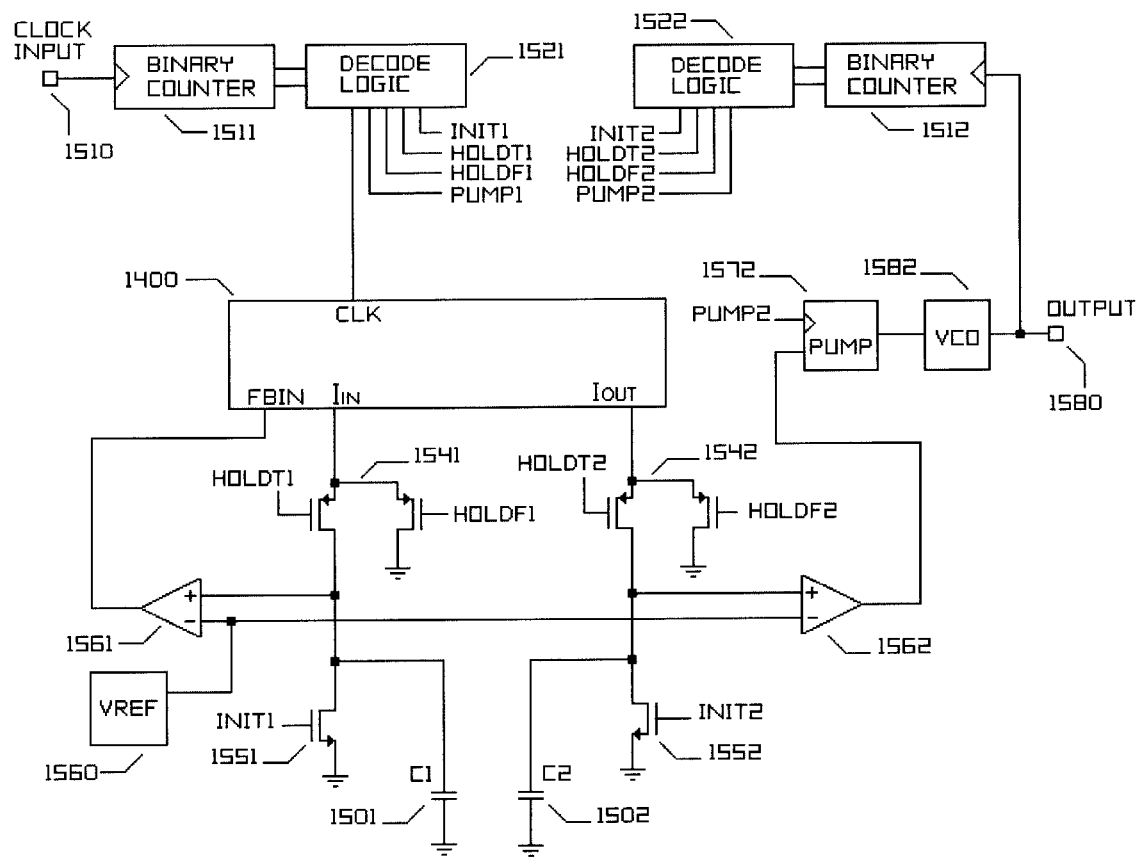
FIG. 15 is a schematic that discloses the module of FIG. 14 connected to other circuit elements to form a tunable oscillator using a reference input frequency, using a voltage reference to establish a switching threshold to two differential comparators.

FIG. 15 discloses an application of the self calibrating current mirror module. FIG. 15 shows a tunable oscillator which is the subject of U.S. patent application Ser. No. 09/118,215 which is herein incorporated by reference in its entirety. The tunable oscillator of FIG. 15 comprises a first and second binary counter 1511 and 1512, first and second decode logic 1521 and 1522, first and second current switch 1541 and 1542, first and second capacitors 1501 and 1502, first and second comparators 1561 and 1562 and first and second discharge MOS transistors 1551 and 1552. In addition the tunable oscillator of FIG. 15 includes a voltage reference 1560, a charge pump 1572 and a voltage controlled oscillator 1582. The tunable oscillator of FIG. 15 has an input 1510 for receiving an input signal having a reference frequency and an output 1580 for providing an output signal having an output frequency. The tunable oscillator of FIG. 15 also includes the self calibrating current mirror module 1400 of FIG. 14. The module replaces a charge pump and a current mirror disclosed in the cited U.S. patent application Ser. No. 09/118,215

The tunable oscillator of FIG. 15 receives an input signal having an input frequency, and converts the input frequency to a current. The current is equal to the input frequency multiplied by the capacitance C1 multiplied by VREF. The current is then replicated using a current mirror. The output of the current mirror then used to drive a current to frequency converter. The tunable oscillator provides an output frequency equal to the input frequency multiplied by the capacitance ratio C1/C2.

The tunable oscillator is very precise provided that the current mirror that is used is accurate. The tunable oscillator of FIG. 15 provides improved performance by using the self calibrating current mirror module 1400.

Figure 16:
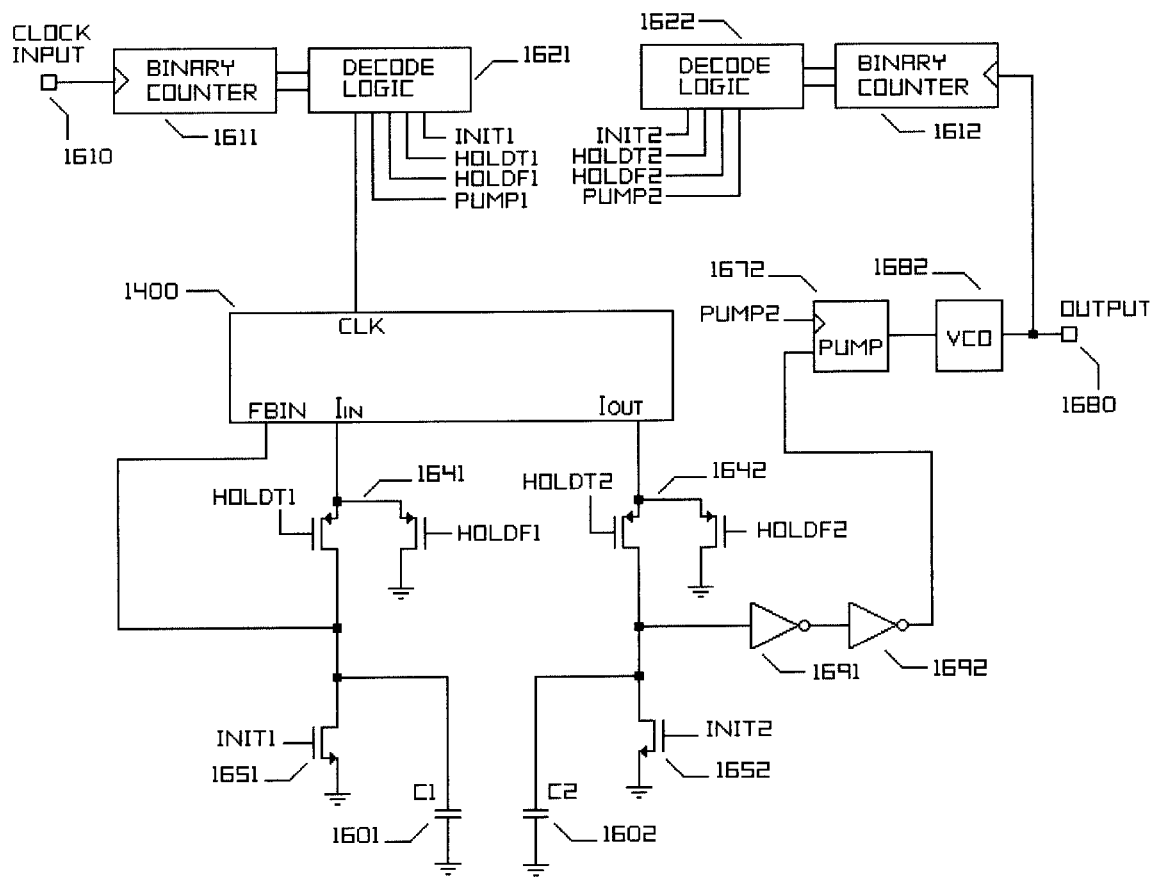
FIG. 16 is a schematic that shows the module of FIG. 14 connected to other circuit elements to form a tunable oscillator with a reference input frequency, using CMOS inverters to establish the switching threshold voltage.

FIG. 16 discloses another embodiment of a tunable oscillator that uses a self calibrating current mirror module 1400 of FIG. 14. The tunable oscillator of FIG. 16 is identical in operation and structure to the tunable oscillator of FIG. 15, except that the first and the second comparator and the voltage reference of FIG. 15 have been eliminated. The tunable oscillator of FIG. 16 utilizes the switching threshold voltage of the FBIN input of the self calibrating current mirror module 1400 to replace the voltage reference and the first comparator. The inverters 1691 and 1692 replace the second comparator of FIG. 15. The self calibrating current mirror module 1400 improves the accuracy of the tunable oscillator of FIG. 16.

Figure 17:
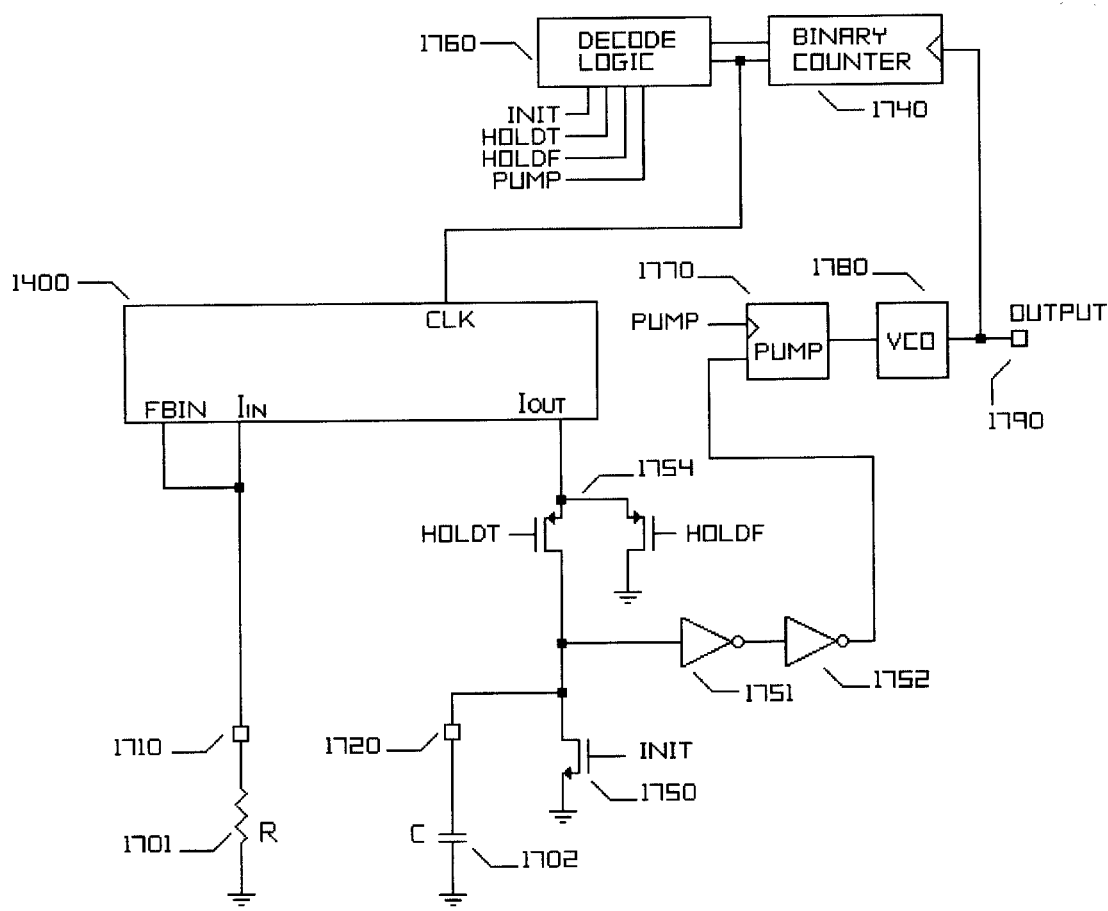
FIG. 17 is a schematic that discloses the module of FIG. 14 connected to other circuit elements to form a self calibrating RC oscillator.

FIG. 17 discloses yet another application of the self calibrating current mirror module 1400. FIG. 17 is a schematic diagram of a self calibrating RC oscillator having improved accuracy. The structure and operation of the self calibrating RC oscillator are discussed in detail in U.S. Pat. No. 5,594,388. In many embodiments of the self calibrating RC oscillator a current mirror is used. The current mirror error often dominates the frequency error that limits performance. The frequency accuracy is never any better than accuracy of the current mirror.

The self calibrating RC oscillator of FIG. 17 comprises an output 1790 for producing an output signal having an output frequency, first input 1710 for connection to a resistor R, second input 1720 for connection to a capacitor C, a current switch 1754, a discharge MOS transistor 1750, a first and second inverter 1751 and 1752, a charge pump 1770, a voltage controlled oscillator 1780, a binary counter 1740 and decode logic 1760. The binary counter 1740 and decode logic 1760 respond to the output frequency of the VCO 1780. The counter and decode logic produce the control signals INIT, HOLDT, HOLDF and PUMP that are used to operate the discharge MOS transistor 1750, current switch 1754 and the charge pump 1770. In addition the self calibrating RC oscillator of FIG. 17 comprises a self calibrating current mirror module 1400. The input Iin is connected to FBIN and to the resistor R using the first input 1710. The output Iout of the self calibrating current mirror module 1400 is connected to the input of the current switch 1754. The CLK input of the self calibrating current mirror module is connected to receive a digital periodic timing signal from the decode logic 1760.

The self calibrating RC oscillator shown by FIG. 17 operates in the following manner. The VCO 1790 produces an output signal having an output frequency. The binary counter 1740 and decode logic respond to the output signal to produce the control signals INIT, HOLDT, HOLDF PUMP and the clock input to the self calibrating current mirror module 1400. Assuming the initial voltage across the resistor input 1710 is a logic 0, the outputs of the charge pumps within the self calibrating current mirror module 1400 shall decrease in voltage. As such, the drain currents of the current mirror MOS transistors shall increase.

The current of the self calibrating current mirror module 1400 at Iin shall increase until the voltage across resistor 1701 approaches the switching threshold voltage of FBIN. The output current Iout of the self calibrating current mirror module 1400 shall replicate the input current. The output current shall charge capacitor 1702 during a charge interval. At the end of the charge interval the capacitor 1702 has a voltage which is the input voltage of first inverter 1751. If the input voltage across capacitor 1702 is exceeds the switching threshold of inverter 1751, the output of inverter 1752 is a logic 1. The output of charge pump 1770 shall increase which increases the output frequency of the VCO 1780. As such the charging interval for charging capacitor 1702 shall decrease. The frequency shall increase until capacitor 1702 charges to the switching threshold voltage of the inverter 1751. The switching threshold voltage of inverter 1751 shall match the switching threshold of FBIN, provided the layout of inverter 1751 matches the first inverter connected to the FBIN input of the self calibrating current mirror module 1400.

The self calibrating RC oscillator of FIG. 17 produces an output frequency of N/MRC, where N is the divide by ratio of the counter, M is the decode logic divide ratio for the charge interval, R is the resistance of resistor 1701, and C is that capacitance of capacitor 1702.

The self calibrating current mirror module of FIG. 14 is useful as a current mirror in numerous applications. These applications include various embodiments of tunable oscillators, self calibrating RC oscillators, frequency to current converters, as well as other applications that require a precision current mirror.

It shall be noted here that the invention is well suited for use with compound semiconductors such as GaAs or InP. The transistors fabricated in these processes have device mismatches that are often much worse than CMOS or BICMOS. Such mismatches have limited such technologies in high precision analog and mixed signal applications. In the case of GaAs, a current mirror MOS transistor becomes a current mirror Shottky Barrier Field Effect Transistor. The invention is adoptable to any fabrication technology that produces devices with reasonable transconductance and high input impedance.

The claimed invention is a self calibrating current mirror having an input for receiving an input current, an output for providing an output current to a load, a comparator with an input, an output and a switching threshold voltage, a charge pump having an input connected to the output of the comparator, at least one current mirror MOS transistor that is responsive to the charge pump output such that the drain current matches the applied input current and means to replicate the input current on the output. The claimed invention provides means to replicate an input current that is very precise.

Most drawing figures in this application disclosed PMOS versions of the invention. It shall be noted that the corresponding NMOS versions of the invention are realized by changing PMOS to NMOS, NMOS to PMOS, and by changing the corresponding power supply connections. The charge pump input polarity remains non-inverting. Negative feedback results from the current mirror MOS transistors.

Various embodiments in this application disclose the use of AND gates. In CMOS the AND gate is obtained using a NAND followed by an inverter. Likewise, an AND gate is also obtained using a NOR gate with inverted signals on the inputs using deMorgan's theorem.

The application discloses various embodiments that include circuit elements such as inverters, AND gates, comparators, charge pumps and other structures. As such, it is possible for others of ordinary skill in the arts to substitute equivalent elements to obtain predictable results based on the disclosures of this application. Therefore, the scope of the present invention must not be limited to only the exact structures disclosed herein. Rather, the scope of the invention is based on the appended claims.

What is claimed is:

1. A self calibrating current mirror comprising:

a current mirror input for receiving an input current;

a current mirror output for providing an output current;

a comparator having an input, an output and a switching threshold voltage, the comparator input being connected to said current mirror input;

a first, second, third and fourth transfer gate each having a control input, an output and a switchable input which passes current to the output upon activation of the control input, the outputs of the first and second transfer gates being connected to the current mirror input, and the outputs of the third and fourth transfer gates being connected to the current mirror output;

a first and second charge pump each having a first input for controlling the pump polarity which is connected to the comparator output, a second input for receiving a clock signal, and a pump output for producing incremental voltage steps responsive to the first and second input;

a digital logic circuit to selectively operate the first and second charge pumps and the control inputs of the first, second, third and fourth transfer gates;

a first current mirror MOS transistor having a drain, a gate and a source, the gate being connected to the pump output of said first charge pump and the drain being connected to the switchable inputs of the first and third transfer gates; and a second current mirror MOS transistor having a drain, a gate and a source, the gate being connected to the pump output of said second charge pump and the drain being connected to the switchable inputs of the second and fourth transfer gates.

2. The self calibrating current mirror of claim 1, wherein said comparator further comprises:

a differential comparator with an output, a non-inverting input connected to the current mirror input, and an inverting input; and a voltage reference circuit having an output connected to the inverting input of said differential comparator to establish a switching threshold voltage.

3. The self calibrating current mirror of claim 1, wherein said comparator further comprises:

a first inverter having an input connected to the current mirror input, and an output and a switching threshold voltage; and a second inverter having an input, an output and a switching threshold voltage, wherein said input is connected to the output of the first inverter, and the output of the second inverter is the output of the comparator.

4. The self calibrating current mirror as recited in claim 1 further comprising:

a first resistor having a first and second resistor terminal, the first resistor terminal is connected to the source of the first current mirror MOS transistor, and the second resistor terminal is connected to the power supply voltage node; and a second resistor having a first and second resistor terminal, the first resistor terminal is connected to the source of said second current mirror MOS transistor is connected mirror MOS transistor, and the second resistor terminal is connected to the power supply voltage node.

5. The self calibrating current mirror of claim 1 further comprising a first and second cascode MOS transistor, each having a source, a a gate and a drain, wherein the gates of both cascode MOS transistors are connected to a circuit for producing a cascode bias voltage, and the source and drain of each cascode MOS transistors is connected between the drain of the corresponding current mirror MOS transistor and the corresponding switchable inputs of said transfer gates.

6. The self calibrating current mirror of claim 1, wherein the digital logic further comprises:
a first digital input for receiving a periodic timing signal;
a second digital input for receiving a mode signal;
a first and second AND gate each having a first input, a second input and an output, the first input of each AND gate being connected to the first digital input, the second input of the first AND gate being connected to the second digital input, the first AND gate output being connected to said second digital input of the first charge pump of claim 1, and second AND gate output being connected to said second input of second charge pump of claim 1; and
an inverter having an input connected to the second digital input and an output for producing an inverted mode signal, the output being connected to the second input of the second AND gate.

7. The self calibrating current mirror of claim 1, wherein the digital logic further comprises:
a digital input for receiving a periodic timing signal;
a first and second flip-flop connected to divide the frequency of the periodic timing signal by two and four respectively, each flip-flop having a TRUE and FALSE output; and
a first and second AND gate each having an output, a first, second and third input, the first input being connected to said first digital input for receiving a periodic timing signal, the second input being connected to the FALSE output of the first flip-flop, the third input of the first AND gate being connected to the FALSE output of the second flip-flop, the third input of the second AND gate being connected to the TRUE output of the second flip-flop, and the output of the first and second AND gates being connected to the first inputs of the respective first and second charge pumps of claim 1.

8. The self calibrating current mirror as recited in claim 7, further comprising:
a digital logic circuit having a first input for receiving a first timing signal, a second input for receiving a second timing signal, a first binary counter responsive to the first timing signal, a second binary counter responsive to the second timing signal, a first decode logic circuit responsive to the first binary counter, and having a plurality of control outputs, a second decode logic circuit having a plurality of control outputs responsive to the second binary counter;
a first and second current switch, each having a control input, an output and a switchable input responsive to the control input, the control input of the first current switch being connected to the corresponding control output of the first decode logic circuit, and the control input of the second current switch being connected to the corresponding control output of the second decode logic circuit, the switchable input of the first current switch being connected to the current mirror input, and the input of the second current switch being connected to the current mirror output;
a first and second discharge MOS transistor each responsive to the corresponding first and second decode logic circuits;

a first and second capacitor, each being connected to the output of the respective first and second current switch, and each being connected to the respective drain of the first and second discharge MOS transistor;
a comparator having an input connected to the second capacitor and an output;
a charge pump having a first and second input and an output, the first input being connected to the output of the comparator, the second input being connected to the corresponding control output of the second decode logic circuit; and
a voltage controlled oscillator having an input and an output, the input being connected said charge pump output and the output being connected to said second input to receive a second timing signal of the digital logic circuit.

9. A self calibrating current mirror as recited in claim 7, further comprising:
an input for connecting a resistor to the current mirror input;
an capacitor input for connection to a capacitor;
a comparator having an input and an output, the input being connected to said capacitor input;
a binary counter having an input for receiving a timing signal and a plurality of counter outputs, the corresponding counter output being connected to the current mirror input for receiving a timing signal;
a decode logic circuit responsive to the binary counter having a plurality of control outputs;
a current switch having a control input, an output and a switchable input responsive to the control input, the control input having a connection to the corresponding control output from the decode logic circuit, the switchable input being connected to the current mirror output, and the current switch output being connected to the capacitor input;
a charge pump having a first input, a second input and an output, the first charge pump input being connected to the comparator output, and the second input being connected to the corresponding output of the binary counter; and
a voltage controlled oscillator having an input connected to the charge pump output, and an output connected to the binary counter input for receiving a timing signal.

10. The self calibrating current mirror of claim 1, wherein the charge pump further comprises:
a first and second transfer gate each having a control input, an output and a switchable input which passes charge upon activation of the control input, the output of the first transfer gate is connected to the switchable input of the second transfer gate, and the output of the second transfer gate is the charge pump output;
a first and second inverter responsive to the clock signal at the second input of the charge pump recited in claim 1, the first and second inverters provide complimentary signals to the first and second transfer gates such that only one transfer gate is conductive;
a first, second and third current source MOS transistor each having a source, gate and drain, and biased to produce a corresponding first, second and third drain current;
a diode connected MOS transistor having a source, a gate and a drain, the gate and drain being connected to the switchable input of the first transfer gate and to the drain of the first current source MOS transistor;

a third transfer gate having a control input responsive to the first input of the charge pump recited in claim 1, an output connected to the diode connected MOS transistor, and a switchable input connected to the drain of the second current mirror MOS transistor;

a MOS transistor connected as an inverting amplifier having a source, a gate connected to the output of the second transfer gate and a drain connected to the drain of the third current source MOS transistor; and a feedback capacitor connected from the gate to the drain of the MOS transistor connected as an inverting amplifier.

11. The self calibrating current mirror of claim 2, wherein said comparator further comprises:

a differential comparator with an output, a non-inverting input connected to the current mirror input, and an inverting input; and a voltage reference circuit having an output connected to the inverting input of said differential comparator to establish a switching threshold voltage.

12. A self calibrating current mirror as recited in claim 2 further comprising:

a first resistor having a first and second resistor terminal, the first resistor terminal is connected to the source of the first current mirror MOS transistor, and the second resistor terminal is connected to the power supply voltage node; and a second resistor having a first and second resistor terminal, the first resistor terminal is connected to the source of said second current mirror MOS transistor is connected mirror MOS transistor, and the second resistor terminal is connected to the power supply voltage node.

13. The self calibrating current mirror of claim 2, wherein said comparator further comprises:

a first inverter having an input connected to the current mirror input, and an output and a switching threshold voltage; and a second inverter having an input, an output and a switching threshold voltage, wherein said input is connected to the output of the first inverter, and the output of the second inverter is the output of the comparator.

14. A multiple level self calibrating current mirror for operation as a switchced current digital to analog converter (DAC) having N discrete current levels, comprising:

a DAC output for providing a multiple level output current;

a plurality of digital inputs for receiving a digital input code;

a reference current input for receiving an input current to be replicated;

a comparator having an input, an output and a switching threshold voltage;

an array of current switches each having a control input, an output connected to said DAC, and a switchable input that conducts current upon activation of the control input, said control input being responsive to the digital input code applied to said plurality of digital inputs;

an array of self calibrating current stages, each current stage having a charge pump with a directional input, a clock input and a pump output, the charge pump directional input being connected to the output of said comparator, and each current stage having a current mirror MOS transistor with a source, a gate connected to the charge pump output and a drain for producing a switchable output current;

an array of transfer gates for switching the drain current of the corresponding self calibrating current stage, each transfer gate having a control input, an output, and a switchable input for conducting current to the output when activated by the control input, the switchable inputs being connected to the corresponding drain of the current mirror MOS transistor within the array of self calibrating current stages, and said drain current is switchable between the reference current input and the switchable input of the corresponding current switch of the array of current switches; and a sequential logic circuit for producing a plurality of control signals in sequential order having a clock input, a first plurality of control outputs and a second plurality of control outputs, the first plurality of control outputs are connected to operate the corresponding clock inputs of the charge pump within the array of self calibrating current stages, and the second plurality of control outputs are connected to operate the corresponding control inputs of the transfer gates within the array of transfer gates.

15. The multiple level self calibrating current mirror of claim 14, wherein the charge pump of each of the self calibrating current stages further comprises:

a first and second transfer gate each having a control input, an output and a switchable input which passes charge upon activation of the control input, the output of the first transfer gate is connected to the switchable input of the second transfer gate, and the output of the second transfer gate is the charge pump output;

a first and second inverter responsive to the clock signal at the clock input of the charge pump, the first and second inverters provide complimentary signals to the first and second transfer gates such that only one transfer gate is conductive;

a first, second and third current source MOS transistor each having a source, gate and drain, and biased to produce a corresponding first, second and third drain current;

a diode connected MOS transistor having a source, a gate and a drain, the gate and drain being connected to the switchable input of the first transfer gate and to the drain of the first current source MOS transistor;

a third transfer gate having a control input responsive to the first input of the charge pump, an output connected to the diode connected MOS transistor, and a switchable input connected to the drain of the second current mirror MOS transistor;

a MOS transistor connected as an inverting amplifier having a source, a gate connected to the output of the second transfer gate and a drain connected to the drain of the third current source MOS transistor; and a feedback capacitor connected from the gate to the drain of the MOS transistor connected as an inverting amplifier.

16. The multiple level self calibrating current mirror of claim 14, wherein the sequential logic circuit further comprises:

a clock input for receiving a periodic timing signal;

an input flip-flop stage connected to divide the frequency of the clock input signal by two;

an input AND gate having a first input, a second input and an output, the first input being connected to the clock input for receiving a periodic timing signal, and the second input being connected to the output of the input flip-flop;

a serial shift register of N master-slave flip-flop stages, each flip-flop stage having a serial input, a clock input, a Q output, and a Q false output;

an array of AND gates of number N, each AND gate having a first and second input, wherein the first input of the AND gate is connected to the output of the corresponding master slave flip-flop in the serial shift register, and the second input is connected to the output of the input AND gate; and a NOR gate having a plurality of inputs on number N and an output, such that each Q output of the shift register is an input to said NOR gate, and the output of the NOR gate is the serial input to the first flip-flop stage of the serial shift register.

17. The multiple level self calibrating current mirror of claim 16, wherein the charge pump of each of the self calibrating current stages further comprises:

a first and second transfer gate each having a control input, an output and a switchable input which passes charge upon activation of the control input, the output of the first transfer gate is connected to the switchable input of the second transfer gate, and the output of the second transfer gate is the charge pump output;

a first and second inverter responsive to the clock signal at the clock input of the charge pump, the first and second inverters provide complimentary signals to the first and second transfer gates such that only one transfer gate is conductive;

a first, second and third current source MOS transistor each having a source, gate and drain, and biased to produce a corresponding first, second and third drain current;

a diode connected MOS transistor having a source, a gate and a drain, the gate and drain being connected to the switchable input of the first transfer gate and to the drain of the first current source MOS transistor;

a third transfer gate having a control input responsive to the first input of the charge pump, an output connected to the diode connected MOS transistor, and a switchable input connected to the drain of the second current mirror MOS transistor;

a MOS transistor connected as an inverting amplifier having a source, a gate connected to the output of the second transfer gate and a drain connected to the drain of the third current source MOS transistor; and a feedback capacitor connected from the gate to the drain of the MOS transistor connected as an inverting amplifier.

18. A multiple level self calibrating current mirror for operation as a switched current digital to analog converter (DAC) having N discrete current levels, comprising:

a DAC output for providing a multiple level output current;

a first plurality of digital inputs for receiving a first digital input code;

a second plurality of digital inputs for receiving a second digital input code;

a first array of self calibrating current mirror stages having a plurality of digital inputs, connected to the first plurality of digital inputs, a current input for receiving an input reference current, a first output for providing a fixed output current that is a binary multiple of the reference input current, and a second output for producing an output current proportional to the binary code of the first plurality of digital inputs, the second output being connected to said DAC output;

a second array of self calibrating current mirror stages having a plurality of digital inputs, connected to the second plurality of digital inputs, a current input for receiving an input reference current, and an output for providing an output current proportional to the binary code of the second plurality of digital inputs, the output being connected to said DAC output; and a third array of self calibrating current mirror stages having a reference current input connected to the first output of the first array of self calibrating current mirror stages, and an output for providing an output current that is fixed binary multiple of the current applied to the reference current input, said output being connected to the current reference input of the second array of current mirror stages.

19. The multiple level self calibrating current mirror for operation as a swithced current digital to analog converter (DAC) having N descrete current levels, as recited in claim 18, wherein the first, second and third array of self calibrating current mirror stages each further comprises:

a comparator having an input, an output and a switching threshold voltage;

an array of self calibrating current stages, each current stage having a charge pump with a directional input, a clock input and a pump output, the charge pump directional input being connected to the output of said comparator, and each current stage having a current mirror MOS transistor with a source, a gate connected to the charge pump output and a drain for producing a switchable output current;

an array of transfer gates for switching the drain current of the corresponding self calibrating current stage, each transfer gate having a control input, an output, and a switchable input for conducting current to the output when activated by the conrol input, the switchable inputs being connected to the corresponding drain of the current mirror MOS transistor within the array of self calibrating current stages, and said drain current is switchable between the reference current input and the output of the corresponding output of said array of self calibrating current mirror stages a sequential logic circuit for producing a plurality of control signals in sequential order having a clock input, a first and second plurality of control outputs, the first plurality of control outputs connected to operate the corresponding clock inputs of the charge pumps within the array of self calibrating current stages, and the second plurality of control outputs are connected to operate the corresponding control inputs of the transfer gates within the array of transfer gates.

20. A method for producing an output current from an input current comprising the steps of:

switching a current of a transconductance device having an input for controlling current responsive to voltage, and an output for producing an output current responsive to said input voltage, said output current being switched from an output node to an input node for calibration;

applying the input current to the input node;

applying the voltage at the input node to an input of a comparator having an output and a switching threshold voltage;

activating a charge pump to incrementaly increase or decrease a voltage applied to the input of the transconductance device, in response to comparator output; and switching the output of the transconductance device to the output node to drive an output load.

* * * * *